(12) United States Patent
Chaji et al.

(10) Patent No.: US 9,355,584 B2
(45) Date of Patent: May 31, 2016

(54) SYSTEM AND METHODS FOR EXTRACTION OF THRESHOLD AND MOBILITY PARAMETERS IN AMOLED DISPLAYS

(71) Applicant: Ignis Innovation Inc., Waterloo (CA)

(72) Inventors: Gholamreza Chaji, Waterloo (CA); Yaser Azizi, Waterloo (CA)

(73) Assignee: Ignis Innovation Inc., Waterloo (CA)

( * ) Notice: Subject to any disclaimer, the term of this patent is extended or adjusted under 35 U.S.C. 154(b) by 0 days.

(21) Appl. No.: 14/680,554

(22) Filed: Apr. 7, 2015

(65) Prior Publication Data

US 2015/0213744 A1 Jul. 30, 2015

Related U.S. Application Data

(63) Continuation of application No. 13/950,795, filed on Jul. 25, 2013, now Pat. No. 9,093,029, which is a continuation of application No. 13/112,468, filed on May 20, 2011, now Pat. No. 8,476,217.

(51) Int. Cl.
*G06F 3/038* (2013.01)
*G09G 5/00* (2006.01)
(Continued)

(52) U.S. Cl.
CPC .............. *G09G 3/006* (2013.01); *G09G 3/3233* (2013.01); *G09G 3/3258* (2013.01); *G09G 3/3291* (2013.01); *G09G 2300/043* (2013.01); *G09G 2300/0819* (2013.01); *G09G 2300/0866* (2013.01); *G09G 2310/0251* (2013.01); *G09G 2320/029* (2013.01);
(Continued)

(58) Field of Classification Search
None
See application file for complete search history.

(56) References Cited

U.S. PATENT DOCUMENTS 3,506,851 A    4/1970  Polkinghorn
3,774,055 A    11/1973 Bapat
(Continued)

FOREIGN PATENT DOCUMENTS

CA    1 294 034    1/1992
CA    2 109 951    11/1992
(Continued)

OTHER PUBLICATIONS

Ahnood : "Effect of threshold voltage instability on field effect mobility in thin film transistors deduced from constant current measurements"; dated Aug. 2009.
(Continued)

*Primary Examiner* — Nicholas Lee
(74) *Attorney, Agent, or Firm* — Nixon Peabody LLP

(57) ABSTRACT

A system to improve the extraction of transistor and OLED parameters in an AMOLED display includes a pixel circuit having an organic light emitting device, a drive device to provide a programmable drive current to the light emitting device, a programming input to provide the programming signal, and a storage device to store the programming signal. A charge-pump amplifier has a current input and a voltage output. The charge-pump amplifier includes an operational amplifier in negative feedback configuration. The feedback is provided by a capacitor connected between the output and the inverting input of the operational amplifier. A common-mode voltage source drives the non-inverting input of the operational amplifier. An electronic switch is coupled across the capacitor to reset the capacitor. A switch module including the input is coupled to the output of the pixel circuit and an output is coupled to the input of the charge-pump amplifier.

6 Claims, 12 Drawing Sheets

(51) Int. Cl.
*G09G 3/00* (2006.01)
*G09G 3/32* (2016.01)

(52) U.S. Cl.
CPC . *G09G 2320/0233* (2013.01); *G09G 2320/043* (2013.01); *G09G 2320/045* (2013.01); *G09G 2330/028* (2013.01)

(56) References Cited

U.S. PATENT DOCUMENTS

| | | |
|---|---|---|
| 4,090,096 A | 5/1978 | Nagami |
| 4,160,934 A | 7/1979 | Kirsch |
| 4,354,162 A | 10/1982 | Wright |
| 4,943,956 A | 7/1990 | Noro |
| 4,996,523 A | 2/1991 | Bell |
| 5,153,420 A | 10/1992 | Hack |
| 5,198,803 A | 3/1993 | Shie |
| 5,204,661 A | 4/1993 | Hack |
| 5,266,515 A | 11/1993 | Robb |
| 5,489,918 A | 2/1996 | Mosier |
| 5,498,880 A | 3/1996 | Lee |
| 5,557,342 A | 9/1996 | Eto |
| 5,572,444 A | 11/1996 | Lentz |
| 5,589,847 A | 12/1996 | Lewis |
| 5,619,033 A | 4/1997 | Weisfield |
| 5,648,276 A | 7/1997 | Hara |
| 5,670,973 A | 9/1997 | Bassetti |
| 5,684,365 A | 11/1997 | Tang |
| 5,691,783 A | 11/1997 | Numao |
| 5,714,968 A | 2/1998 | Ikeda |
| 5,723,950 A | 3/1998 | Wei |
| 5,744,824 A | 4/1998 | Kousai |
| 5,745,660 A | 4/1998 | Kolpatzik |
| 5,748,160 A | 5/1998 | Shieh |
| 5,815,303 A | 9/1998 | Berlin |
| 5,870,071 A | 2/1999 | Kawahata |
| 5,874,803 A | 2/1999 | Garbuzov |
| 5,880,582 A | 3/1999 | Sawada |
| 5,903,248 A | 5/1999 | Irwin |
| 5,917,280 A | 6/1999 | Burrows |
| 5,923,794 A | 7/1999 | McGrath |
| 5,945,972 A | 8/1999 | Okumura |
| 5,949,398 A | 9/1999 | Kim |
| 5,952,789 A | 9/1999 | Stewart |
| 5,952,991 A | 9/1999 | Akiyama |
| 5,982,104 A | 11/1999 | Sasaki |
| 5,990,629 A | 11/1999 | Yamada |
| 6,023,259 A | 2/2000 | Howard |
| 6,069,365 A | 5/2000 | Chow |
| 6,091,203 A | 7/2000 | Kawashima |
| 6,097,360 A | 8/2000 | Holloman |
| 6,144,222 A | 11/2000 | Ho |
| 6,177,915 B1 | 1/2001 | Beeteson |
| 6,229,506 B1 | 5/2001 | Dawson |
| 6,229,508 B1 | 5/2001 | Kane |
| 6,246,180 B1 | 6/2001 | Nishigaki |
| 6,252,248 B1 | 6/2001 | Sano |
| 6,259,424 B1 | 7/2001 | Kurogane |
| 6,262,589 B1 | 7/2001 | Tamukai |
| 6,271,825 B1 | 8/2001 | Greene |
| 6,288,696 B1 | 9/2001 | Holloman |
| 6,304,039 B1 | 10/2001 | Appelberg |
| 6,307,322 B1 | 10/2001 | Dawson |
| 6,310,962 B1 | 10/2001 | Chung |
| 6,320,325 B1 | 11/2001 | Cok |
| 6,323,631 B1 | 11/2001 | Juang |
| 6,356,029 B1 | 3/2002 | Hunter |
| 6,373,454 B1 | 4/2002 | Knapp |
| 6,392,617 B1 | 5/2002 | Gleason |
| 6,414,661 B1 | 7/2002 | Shen |
| 6,417,825 B1 | 7/2002 | Stewart |
| 6,433,488 B1 | 8/2002 | Bu |
| 6,437,106 B1 | 8/2002 | Stoner |
| 6,445,369 B1 | 9/2002 | Yang |
| 6,475,845 B2 | 11/2002 | Kimura |
| 6,501,098 B2 | 12/2002 | Yamazaki |
| 6,501,466 B1 | 12/2002 | Yamagishi |
| 6,518,962 B2 | 2/2003 | Kimura |
| 6,522,315 B2 | 2/2003 | Ozawa |
| 6,525,683 B1 | 2/2003 | Gu |
| 6,531,827 B2 | 3/2003 | Kawashima |
| 6,542,138 B1 | 4/2003 | Shannon |
| 6,555,420 B1 | 4/2003 | Yamazaki |
| 6,580,408 B1 | 6/2003 | Bae |
| 6,580,657 B2 | 6/2003 | Sanford |
| 6,583,398 B2 | 6/2003 | Harkin |
| 6,583,775 B1 | 6/2003 | Sekiya |
| 6,594,606 B2 | 7/2003 | Everitt |
| 6,618,030 B2 | 9/2003 | Kane |
| 6,639,244 B1 | 10/2003 | Yamazaki |
| 6,668,645 B1 | 12/2003 | Gilmour |
| 6,677,713 B1 | 1/2004 | Sung |
| 6,680,580 B1 | 1/2004 | Sung |
| 6,687,266 B1 | 2/2004 | Ma |
| 6,690,000 B1 | 2/2004 | Muramatsu |
| 6,690,344 B1 | 2/2004 | Takeuchi |
| 6,693,388 B2 | 2/2004 | Oomura |
| 6,693,610 B2 | 2/2004 | Shannon |
| 6,697,057 B2 | 2/2004 | Koyama |
| 6,720,942 B2 | 4/2004 | Lee |
| 6,724,151 B2 | 4/2004 | Yoo |
| 6,734,636 B2 | 5/2004 | Sanford |
| 6,738,034 B2 | 5/2004 | Kaneko |
| 6,738,035 B1 | 5/2004 | Fan |
| 6,753,655 B2 | 6/2004 | Shih |
| 6,753,834 B2 | 6/2004 | Mikami |
| 6,756,741 B2 | 6/2004 | Li |
| 6,756,952 B1 | 6/2004 | Decaux |
| 6,756,958 B2 | 6/2004 | Furuhashi |
| 6,771,028 B1 | 8/2004 | Winters |
| 6,777,712 B2 | 8/2004 | Sanford |
| 6,777,888 B2 | 8/2004 | Kondo |
| 6,781,567 B2 | 8/2004 | Kimura |
| 6,806,497 B2 | 10/2004 | Jo |
| 6,806,638 B2 | 10/2004 | Lih et al. |
| 6,806,857 B2 | 10/2004 | Sempel |
| 6,809,706 B2 | 10/2004 | Shimoda |
| 6,815,975 B2 | 11/2004 | Nara |
| 6,828,950 B2 | 12/2004 | Koyama |
| 6,853,371 B2 | 2/2005 | Miyajima |
| 6,859,193 B1 | 2/2005 | Yumoto |
| 6,873,117 B2 | 3/2005 | Ishizuka |
| 6,876,346 B2 | 4/2005 | Anzai |
| 6,885,356 B2 | 4/2005 | Hashimoto |
| 6,900,485 B2 | 5/2005 | Lee |
| 6,903,734 B2 | 6/2005 | Eu |
| 6,909,243 B2 | 6/2005 | Inukai |
| 6,909,419 B2 | 6/2005 | Zavracky |
| 6,911,960 B1 | 6/2005 | Yokoyama |
| 6,911,964 B2 | 6/2005 | Lee |
| 6,914,448 B2 | 7/2005 | Jinno |
| 6,919,871 B2 | 7/2005 | Kwon |
| 6,924,602 B2 | 8/2005 | Komiya |
| 6,937,215 B2 | 8/2005 | Lo |
| 6,937,220 B2 | 8/2005 | Kitaura |
| 6,940,214 B1 | 9/2005 | Komiya |
| 6,943,500 B2 | 9/2005 | LeChevalier |
| 6,947,022 B2 | 9/2005 | McCartney |
| 6,954,194 B2 | 10/2005 | Matsumoto |
| 6,956,547 B2 | 10/2005 | Bae |
| 6,975,142 B2 | 12/2005 | Azami |
| 6,975,332 B2 | 12/2005 | Arnold |
| 6,995,510 B2 | 2/2006 | Murakami |
| 6,995,519 B2 | 2/2006 | Arnold |
| 7,023,408 B2 | 4/2006 | Chen |
| 7,027,015 B2 | 4/2006 | Booth, Jr. |
| 7,027,078 B2 | 4/2006 | Reihl |
| 7,034,793 B2 | 4/2006 | Sekiya |
| 7,038,392 B2 | 5/2006 | Libsch |
| 7,057,359 B2 | 6/2006 | Hung |
| 7,061,451 B2 | 6/2006 | Kimura |
| 7,064,733 B2 | 6/2006 | Cok |
| 7,071,932 B2 | 7/2006 | Libsch |
| 7,088,051 B1 | 8/2006 | Cok |

(56) References Cited

U.S. PATENT DOCUMENTS

| | | |
|---|---|---|
| 7,088,052 B2 | 8/2006 | Kimura |
| 7,102,378 B2 | 9/2006 | Kuo |
| 7,106,285 B2 | 9/2006 | Naugler |
| 7,112,820 B2 | 9/2006 | Chang |
| 7,116,058 B2 | 10/2006 | Lo |
| 7,119,493 B2 | 10/2006 | Fryer |
| 7,122,835 B1 | 10/2006 | Ikeda |
| 7,127,380 B1 | 10/2006 | Iverson |
| 7,129,914 B2 | 10/2006 | Knapp |
| 7,161,566 B2 | 1/2007 | Cok |
| 7,164,417 B2 | 1/2007 | Cok |
| 7,193,589 B2 | 3/2007 | Yoshida |
| 7,224,332 B2 | 5/2007 | Cok |
| 7,227,519 B1 | 6/2007 | Kawase |
| 7,245,277 B2 | 7/2007 | Ishizuka |
| 7,248,236 B2 | 7/2007 | Nathan |
| 7,262,753 B2 | 8/2007 | Tanghe |
| 7,274,363 B2 | 9/2007 | Ishizuka |
| 7,310,092 B2 | 12/2007 | Imamura |
| 7,315,295 B2 | 1/2008 | Kimura |
| 7,321,348 B2 | 1/2008 | Cok |
| 7,339,560 B2 | 3/2008 | Sun |
| 7,355,574 B1 | 4/2008 | Leon |
| 7,358,941 B2 | 4/2008 | Ono |
| 7,368,868 B2 | 5/2008 | Sakamoto |
| 7,397,485 B2 | 7/2008 | Miller |
| 7,411,571 B2 | 8/2008 | Huh |
| 7,414,600 B2 | 8/2008 | Nathan |
| 7,423,617 B2 | 9/2008 | Giraldo |
| 7,453,054 B2 | 11/2008 | Lee |
| 7,474,285 B2 | 1/2009 | Kimura |
| 7,502,000 B2 | 3/2009 | Yuki |
| 7,528,812 B2 | 5/2009 | Tsuge |
| 7,535,449 B2 | 5/2009 | Miyazawa |
| 7,554,512 B2 | 6/2009 | Steer |
| 7,569,849 B2 | 8/2009 | Nathan |
| 7,576,718 B2 | 8/2009 | Miyazawa |
| 7,580,012 B2 | 8/2009 | Kim |
| 7,589,707 B2 | 9/2009 | Chou |
| 7,609,239 B2 | 10/2009 | Chang |
| 7,619,594 B2 | 11/2009 | Hu |
| 7,619,597 B2 | 11/2009 | Nathan |
| 7,633,470 B2 | 12/2009 | Kane |
| 7,656,370 B2 | 2/2010 | Schneider |
| 7,800,558 B2 | 9/2010 | Routley |
| 7,847,764 B2 | 12/2010 | Cok |
| 7,859,492 B2 | 12/2010 | Kohno |
| 7,868,859 B2 | 1/2011 | Tomida |
| 7,876,294 B2 | 1/2011 | Sasaki |
| 7,924,249 B2 | 4/2011 | Nathan |
| 7,932,883 B2 | 4/2011 | Klompenhouwer |
| 7,969,390 B2 | 6/2011 | Yoshida |
| 7,978,187 B2 | 7/2011 | Nathan |
| 7,994,712 B2 | 8/2011 | Sung |
| 8,026,876 B2 | 9/2011 | Nathan |
| 8,049,420 B2 | 11/2011 | Tamura |
| 8,077,123 B2 | 12/2011 | Naugler, Jr. |
| 8,115,707 B2 | 2/2012 | Nathan |
| 8,208,084 B2 | 6/2012 | Lin |
| 8,223,177 B2 | 7/2012 | Nathan |
| 8,232,939 B2 | 7/2012 | Nathan |
| 8,259,044 B2 | 9/2012 | Nathan |
| 8,264,431 B2 | 9/2012 | Bulovic |
| 8,279,143 B2 | 10/2012 | Nathan |
| 8,339,386 B2 | 12/2012 | Leon |
| 8,441,206 B2 | 5/2013 | Myers |
| 8,493,296 B2 | 7/2013 | Ogawa |
| 2001/0002703 A1 | 6/2001 | Koyama |
| 2001/0009283 A1 | 7/2001 | Arao |
| 2001/0024181 A1 | 9/2001 | Kubota |
| 2001/0024186 A1 | 9/2001 | Kane |
| 2001/0026257 A1 | 10/2001 | Kimura |
| 2001/0030323 A1 | 10/2001 | Ikeda |
| 2001/0035863 A1 | 11/2001 | Kimura |
| 2001/0038367 A1 | 11/2001 | Inukai |
| 2001/0040541 A1 | 11/2001 | Yoneda |
| 2001/0043173 A1 | 11/2001 | Troutman |
| 2001/0045929 A1 | 11/2001 | Prache |
| 2001/0052606 A1 | 12/2001 | Sempel |
| 2001/0052940 A1 | 12/2001 | Hagihara |
| 2002/0000576 A1 | 1/2002 | Inukai |
| 2002/0011796 A1 | 1/2002 | Koyama |
| 2002/0011799 A1 | 1/2002 | Kimura |
| 2002/0012057 A1 | 1/2002 | Kimura |
| 2002/0014851 A1 | 2/2002 | Tai |
| 2002/0018034 A1 | 2/2002 | Ohki |
| 2002/0030190 A1 | 3/2002 | Ohtani |
| 2002/0047565 A1 | 4/2002 | Nara |
| 2002/0052086 A1 | 5/2002 | Maeda |
| 2002/0067134 A1 | 6/2002 | Kawashima |
| 2002/0084463 A1 | 7/2002 | Sanford |
| 2002/0101152 A1 | 8/2002 | Kimura |
| 2002/0101172 A1 | 8/2002 | Bu |
| 2002/0105279 A1 | 8/2002 | Kimura |
| 2002/0117722 A1 | 8/2002 | Osada |
| 2002/0122308 A1 | 9/2002 | Ikeda |
| 2002/0158587 A1 | 10/2002 | Komiya |
| 2002/0158666 A1 | 10/2002 | Azami |
| 2002/0158823 A1 | 10/2002 | Zavracky |
| 2002/0167471 A1 | 11/2002 | Everitt |
| 2002/0167474 A1 | 11/2002 | Everitt |
| 2002/0180369 A1 | 12/2002 | Koyama |
| 2002/0180721 A1 | 12/2002 | Kimura |
| 2002/0181276 A1 | 12/2002 | Yamazaki |
| 2002/0186214 A1 | 12/2002 | Siwinski |
| 2002/0190924 A1 | 12/2002 | Asano |
| 2002/0190971 A1 | 12/2002 | Nakamura |
| 2002/0195967 A1 | 12/2002 | Kim |
| 2002/0195968 A1 | 12/2002 | Sanford |
| 2003/0020413 A1 | 1/2003 | Oomura |
| 2003/0030603 A1 | 2/2003 | Shimoda |
| 2003/0043088 A1 | 3/2003 | Booth |
| 2003/0057895 A1 | 3/2003 | Kimura |
| 2003/0058226 A1 | 3/2003 | Bertram |
| 2003/0062524 A1 | 4/2003 | Kimura |
| 2003/0063081 A1 | 4/2003 | Kimura |
| 2003/0071821 A1 | 4/2003 | Sundahl |
| 2003/0076048 A1 | 4/2003 | Rutherford |
| 2003/0090447 A1 | 5/2003 | Kimura |
| 2003/0090481 A1 | 5/2003 | Kimura |
| 2003/0107560 A1 | 6/2003 | Yumoto |
| 2003/0111966 A1 | 6/2003 | Mikami |
| 2003/0122745 A1 | 7/2003 | Miyazawa |
| 2003/0122813 A1 | 7/2003 | Ishizuki |
| 2003/0142088 A1 | 7/2003 | LeChevalier |
| 2003/0151569 A1 | 8/2003 | Lee |
| 2003/0156101 A1 | 8/2003 | Le Chevalier |
| 2003/0174152 A1 | 9/2003 | Noguchi |
| 2003/0179626 A1 | 9/2003 | Sanford |
| 2003/0185438 A1 | 10/2003 | Osawa |
| 2003/0197663 A1 | 10/2003 | Lee |
| 2003/0210256 A1 | 11/2003 | Mori |
| 2003/0230141 A1 | 12/2003 | Gilmour |
| 2003/0230980 A1 | 12/2003 | Forrest |
| 2003/0231148 A1 | 12/2003 | Lin |
| 2004/0032382 A1 | 2/2004 | Cok |
| 2004/0041750 A1 | 3/2004 | Abe |
| 2004/0066357 A1 | 4/2004 | Kawasaki |
| 2004/0070557 A1 | 4/2004 | Asano |
| 2004/0070565 A1 | 4/2004 | Nayar |
| 2004/0090186 A1 | 5/2004 | Kanauchi |
| 2004/0090400 A1 | 5/2004 | Yoo |
| 2004/0095297 A1 | 5/2004 | Libsch |
| 2004/0100427 A1 | 5/2004 | Miyazawa |
| 2004/0108518 A1 | 6/2004 | Jo |
| 2004/0135749 A1 | 7/2004 | Kondakov |
| 2004/0140982 A1 | 7/2004 | Pate |
| 2004/0145547 A1 | 7/2004 | Oh |
| 2004/0150592 A1 | 8/2004 | Mizukoshi |
| 2004/0150594 A1 | 8/2004 | Koyama |
| 2004/0150595 A1 | 8/2004 | Kasai |
| 2004/0155841 A1 | 8/2004 | Kasai |
| 2004/0174347 A1 | 9/2004 | Sun |
| 2004/0174349 A1 | 9/2004 | Libsch |

(56) References Cited

U.S. PATENT DOCUMENTS

| | | |
|---|---|---|
| 2004/0174354 A1 | 9/2004 | Ono |
| 2004/0178743 A1 | 9/2004 | Miller |
| 2004/0183759 A1 | 9/2004 | Stevenson |
| 2004/0196275 A1 | 10/2004 | Hattori |
| 2004/0207615 A1 | 10/2004 | Yumoto |
| 2004/0227697 A1 | 11/2004 | Mori |
| 2004/0233125 A1 | 11/2004 | Tanghe |
| 2004/0239596 A1 | 12/2004 | Ono |
| 2004/0252089 A1 | 12/2004 | Ono |
| 2004/0257313 A1 | 12/2004 | Kawashima |
| 2004/0257353 A1 | 12/2004 | Imamura |
| 2004/0257355 A1 | 12/2004 | Naugler |
| 2004/0263437 A1 | 12/2004 | Hattori |
| 2004/0263444 A1 | 12/2004 | Kimura |
| 2004/0263445 A1 | 12/2004 | Inukai |
| 2004/0263541 A1 | 12/2004 | Takeuchi |
| 2005/0007355 A1 | 1/2005 | Miura Hirotsuna |
| 2005/0007357 A1 | 1/2005 | Yamashita |
| 2005/0007392 A1 | 1/2005 | Kasai |
| 2005/0017650 A1 | 1/2005 | Fryer |
| 2005/0024081 A1 | 2/2005 | Kuo |
| 2005/0024393 A1 | 2/2005 | Kondo |
| 2005/0030267 A1 | 2/2005 | Tanghe |
| 2005/0057484 A1 | 3/2005 | Diefenbaugh |
| 2005/0057580 A1 | 3/2005 | Yamano |
| 2005/0067970 A1 | 3/2005 | Libsch |
| 2005/0067971 A1 | 3/2005 | Kane |
| 2005/0068270 A1 | 3/2005 | Awakura |
| 2005/0068275 A1 | 3/2005 | Kane |
| 2005/0073264 A1 | 4/2005 | Matsumoto |
| 2005/0083323 A1 | 4/2005 | Suzuki |
| 2005/0088103 A1 | 4/2005 | Kageyama |
| 2005/0110420 A1 | 5/2005 | Arnold |
| 2005/0110807 A1 | 5/2005 | Chang |
| 2005/0122294 A1 | 6/2005 | Ben-David |
| 2005/0140598 A1 | 6/2005 | Kim |
| 2005/0140610 A1 | 6/2005 | Smith |
| 2005/0145891 A1 | 7/2005 | Abe |
| 2005/0156831 A1 | 7/2005 | Yamazaki |
| 2005/0162079 A1 | 7/2005 | Sakamoto |
| 2005/0168416 A1 | 8/2005 | Hashimoto |
| 2005/0179626 A1 | 8/2005 | Yuki |
| 2005/0179628 A1 | 8/2005 | Kimura |
| 2005/0185200 A1 | 8/2005 | Tobol |
| 2005/0200575 A1 | 9/2005 | Kim |
| 2005/0206590 A1 | 9/2005 | Sasaki |
| 2005/0212787 A1 | 9/2005 | Noguchi |
| 2005/0219184 A1 | 10/2005 | Zehner |
| 2005/0225683 A1 | 10/2005 | Nozawa |
| 2005/0248515 A1 | 11/2005 | Naugler |
| 2005/0269959 A1 | 12/2005 | Uchino |
| 2005/0269960 A1 | 12/2005 | Ono |
| 2005/0280615 A1 | 12/2005 | Cok |
| 2005/0280766 A1 | 12/2005 | Johnson |
| 2005/0285822 A1 | 12/2005 | Reddy |
| 2005/0285825 A1 | 12/2005 | Eom |
| 2006/0001613 A1 | 1/2006 | Routley |
| 2006/0007072 A1 | 1/2006 | Choi |
| 2006/0007249 A1 | 1/2006 | Reddy |
| 2006/0012310 A1 | 1/2006 | Chen |
| 2006/0012311 A1 | 1/2006 | Ogawa |
| 2006/0015272 A1 | 1/2006 | Giraldo et al. |
| 2006/0022305 A1 | 2/2006 | Yamashita |
| 2006/0027807 A1 | 2/2006 | Nathan |
| 2006/0030084 A1 | 2/2006 | Young |
| 2006/0038758 A1 | 2/2006 | Routley |
| 2006/0038762 A1 | 2/2006 | Chou |
| 2006/0044227 A1 | 3/2006 | Hadcock |
| 2006/0066533 A1 | 3/2006 | Sato |
| 2006/0077135 A1 | 4/2006 | Cok |
| 2006/0077142 A1 | 4/2006 | Kwon |
| 2006/0082523 A1 | 4/2006 | Guo |
| 2006/0092185 A1 | 5/2006 | Jo |
| 2006/0097628 A1 | 5/2006 | Suh |
| 2006/0097631 A1 | 5/2006 | Lee |
| 2006/0103611 A1 | 5/2006 | Choi |
| 2006/0125740 A1 | 6/2006 | Shirasaki et al. |
| 2006/0149493 A1 | 7/2006 | Sambandan |
| 2006/0170623 A1 | 8/2006 | Naugler, Jr. |
| 2006/0176250 A1 | 8/2006 | Nathan |
| 2006/0208961 A1 | 9/2006 | Nathan |
| 2006/0208971 A1 | 9/2006 | Deane |
| 2006/0214888 A1 | 9/2006 | Schneider |
| 2006/0231740 A1 | 10/2006 | Kasai |
| 2006/0232522 A1 | 10/2006 | Roy |
| 2006/0244697 A1 | 11/2006 | Lee |
| 2006/0261841 A1 | 11/2006 | Fish |
| 2006/0273997 A1 | 12/2006 | Nathan |
| 2006/0279481 A1 | 12/2006 | Haruna |
| 2006/0284801 A1 | 12/2006 | Yoon |
| 2006/0284802 A1 | 12/2006 | Kohno |
| 2006/0284895 A1 | 12/2006 | Marcu |
| 2006/0290618 A1 | 12/2006 | Goto |
| 2007/0001937 A1 | 1/2007 | Park |
| 2007/0001939 A1 | 1/2007 | Hashimoto |
| 2007/0008251 A1 | 1/2007 | Kohno |
| 2007/0008268 A1 | 1/2007 | Park |
| 2007/0008297 A1 | 1/2007 | Bassetti |
| 2007/0057873 A1 | 3/2007 | Uchino |
| 2007/0057874 A1 | 3/2007 | Le Roy |
| 2007/0069998 A1 | 3/2007 | Naugler |
| 2007/0075727 A1 | 4/2007 | Nakano |
| 2007/0076226 A1 | 4/2007 | Klompenhouwer |
| 2007/0080905 A1 | 4/2007 | Takahara |
| 2007/0080906 A1 | 4/2007 | Tanabe |
| 2007/0080908 A1 | 4/2007 | Nathan |
| 2007/0097038 A1 | 5/2007 | Yamazaki |
| 2007/0097041 A1 | 5/2007 | Park |
| 2007/0103411 A1 | 5/2007 | Cok et al. |
| 2007/0103419 A1 | 5/2007 | Uchino |
| 2007/0115221 A1 | 5/2007 | Buchhauser |
| 2007/0126672 A1 | 6/2007 | Tada et al. |
| 2007/0164664 A1 | 7/2007 | Ludwicki |
| 2007/0164938 A1 | 7/2007 | Shin |
| 2007/0182671 A1 | 8/2007 | Nathan |
| 2007/0236134 A1 | 10/2007 | Ho |
| 2007/0236440 A1 | 10/2007 | Wacyk |
| 2007/0236517 A1 | 10/2007 | Kimpe |
| 2007/0241999 A1 | 10/2007 | Lin |
| 2007/0273294 A1 | 11/2007 | Nagayama |
| 2007/0285359 A1 | 12/2007 | Ono |
| 2007/0290957 A1 | 12/2007 | Cok |
| 2007/0290958 A1 | 12/2007 | Cok |
| 2007/0296672 A1 | 12/2007 | Kim |
| 2008/0001525 A1 | 1/2008 | Chao |
| 2008/0001544 A1 | 1/2008 | Murakami |
| 2008/0030518 A1 | 2/2008 | Higgins |
| 2008/0036706 A1 | 2/2008 | Kitazawa |
| 2008/0036708 A1 | 2/2008 | Shirasaki |
| 2008/0042942 A1 | 2/2008 | Takahashi |
| 2008/0042948 A1 | 2/2008 | Yamashita |
| 2008/0048951 A1 | 2/2008 | Naugler, Jr. |
| 2008/0055209 A1 | 3/2008 | Cok |
| 2008/0055211 A1 | 3/2008 | Ogawa |
| 2008/0074413 A1 | 3/2008 | Ogura |
| 2008/0088549 A1 | 4/2008 | Nathan |
| 2008/0088648 A1 | 4/2008 | Nathan |
| 2008/0111766 A1 | 5/2008 | Uchino |
| 2008/0116787 A1 | 5/2008 | Hsu |
| 2008/0117144 A1 | 5/2008 | Nakano et al. |
| 2008/0136770 A1 | 6/2008 | Peker et al. |
| 2008/0150845 A1 | 6/2008 | Ishii |
| 2008/0150847 A1 | 6/2008 | Kim |
| 2008/0158115 A1 | 7/2008 | Cordes |
| 2008/0158648 A1 | 7/2008 | Cummings |
| 2008/0191976 A1 | 8/2008 | Nathan |
| 2008/0198103 A1 | 8/2008 | Toyomura |
| 2008/0211749 A1 | 9/2008 | Weitbruch |
| 2008/0231558 A1 | 9/2008 | Naugler |
| 2008/0231562 A1 | 9/2008 | Kwon |
| 2008/0231625 A1 | 9/2008 | Minami |
| 2008/0246713 A1 | 10/2008 | Lee |
| 2008/0252223 A1 | 10/2008 | Toyoda |
| 2008/0252571 A1 | 10/2008 | Hente |

(56) References Cited

U.S. PATENT DOCUMENTS

| | | |
|---|---|---|
| 2008/0259020 A1 | 10/2008 | Fisekovic |
| 2008/0290805 A1 | 11/2008 | Yamada |
| 2008/0297055 A1 | 12/2008 | Miyake |
| 2009/0058772 A1 | 3/2009 | Lee |
| 2009/0109142 A1 | 4/2009 | Takahara |
| 2009/0121994 A1 | 5/2009 | Miyata |
| 2009/0146926 A1 | 6/2009 | Sung |
| 2009/0160743 A1 | 6/2009 | Tomida |
| 2009/0174628 A1 | 7/2009 | Wang |
| 2009/0184901 A1 | 7/2009 | Kwon |
| 2009/0195483 A1 | 8/2009 | Naugler, Jr. |
| 2009/0201281 A1 | 8/2009 | Routley |
| 2009/0206764 A1 | 8/2009 | Schemmann |
| 2009/0213046 A1 | 8/2009 | Nam |
| 2009/0244046 A1 | 10/2009 | Seto |
| 2009/0262047 A1 | 10/2009 | Yamashita |
| 2010/0004891 A1 | 1/2010 | Ahlers |
| 2010/0026725 A1 | 2/2010 | Smith |
| 2010/0039422 A1 | 2/2010 | Seto |
| 2010/0039458 A1 | 2/2010 | Nathan |
| 2010/0060911 A1 | 3/2010 | Marcu |
| 2010/0079419 A1 | 4/2010 | Shibusawa |
| 2010/0085282 A1 | 4/2010 | Yu |
| 2010/0103160 A1 | 4/2010 | Jeon |
| 2010/0165002 A1 | 7/2010 | Ahn |
| 2010/0188320 A1* | 7/2010 | Min et al. .................. 345/80 |
| 2010/0194670 A1 | 8/2010 | Cok |
| 2010/0207960 A1 | 8/2010 | Kimpe |
| 2010/0225630 A1 | 9/2010 | Levey |
| 2010/0251295 A1 | 9/2010 | Amento |
| 2010/0277400 A1 | 11/2010 | Jeong |
| 2010/0315319 A1 | 12/2010 | Cok |
| 2011/0050870 A1 | 3/2011 | Hanari |
| 2011/0063197 A1 | 3/2011 | Chung |
| 2011/0069051 A1 | 3/2011 | Nakamura |
| 2011/0069089 A1 | 3/2011 | Kopf |
| 2011/0069096 A1 | 3/2011 | Li |
| 2011/0074750 A1 | 3/2011 | Leon |
| 2011/0149166 A1 | 6/2011 | Botzas |
| 2011/0169798 A1 | 7/2011 | Lee |
| 2011/0175895 A1 | 7/2011 | Hayakawa |
| 2011/0181630 A1 | 7/2011 | Smith |
| 2011/0199395 A1 | 8/2011 | Nathan |
| 2011/0227964 A1 | 9/2011 | Chaji |
| 2011/0242074 A1 | 10/2011 | Bert et al. |
| 2011/0273399 A1 | 11/2011 | Lee |
| 2011/0292006 A1 | 12/2011 | Kim |
| 2011/0293480 A1 | 12/2011 | Mueller |
| 2012/0056558 A1 | 3/2012 | Toshiya |
| 2012/0062565 A1 | 3/2012 | Fuchs |
| 2012/0262184 A1 | 10/2012 | Shen |
| 2012/0299970 A1 | 11/2012 | Bae |
| 2012/0299978 A1 | 11/2012 | Chaji |
| 2013/0027381 A1 | 1/2013 | Nathan |
| 2013/0057595 A1 | 3/2013 | Nathan |
| 2013/0112960 A1 | 5/2013 | Chaji |
| 2013/0135272 A1 | 5/2013 | Park |
| 2013/0162617 A1 | 6/2013 | Yoon |
| 2013/0201223 A1 | 8/2013 | Li et al. |
| 2013/0309821 A1 | 11/2013 | Yoo |
| 2013/0321671 A1 | 12/2013 | Cote |
| 2014/0111567 A1 | 4/2014 | Arokia et al. |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 432 530 | 7/2002 |
| CA | 2 436 451 | 8/2002 |
| CA | 2 438 577 | 8/2002 |
| CA | 2 463 653 | 1/2004 |
| CA | 2 498 136 | 3/2004 |
| CA | 2 522 396 | 11/2004 |
| CA | 2 443 206 | 3/2005 |
| CA | 2 472 671 | 12/2005 |
| CA | 2 567 076 | 1/2006 |
| CA | 2 526 782 | 4/2006 |
| CA | 2 541 531 | 7/2006 |
| CA | 2 550 102 | 4/2008 |
| CA | 2 773 699 | 10/2013 |
| CN | 1381032 | 11/2002 |
| CN | 1448908 | 10/2003 |
| CN | 1682267 A | 10/2005 |
| CN | 1760945 | 4/2006 |
| CN | 1886774 | 12/2006 |
| CN | 101449311 | 6/2009 |
| CN | 102656621 | 9/2012 |
| EP | 0 158 366 | 10/1985 |
| EP | 1 028 471 | 8/2000 |
| EP | 1 111 577 | 6/2001 |
| EP | 1 130 565 A1 | 9/2001 |
| EP | 1 194 013 | 4/2002 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 145 0341 A | 8/2004 |
| EP | 1 465 143 A | 10/2004 |
| EP | 1 469 448 A | 10/2004 |
| EP | 1 521 203 A2 | 4/2005 |
| EP | 1 594 347 | 11/2005 |
| EP | 1 784 055 A2 | 5/2007 |
| EP | 1854338 A1 | 11/2007 |
| EP | 1 879 169 A1 | 1/2008 |
| EP | 1 879 172 | 1/2008 |
| EP | 2395499 A1 | 12/2011 |
| GB | 2 389 951 | 12/2003 |
| JP | 1272298 | 10/1989 |
| JP | 4-042619 | 2/1992 |
| JP | 6-314977 | 11/1994 |
| JP | 8-340243 | 12/1996 |
| JP | 09-090405 | 4/1997 |
| JP | 10-254410 | 9/1998 |
| JP | 11-202295 | 7/1999 |
| JP | 11-219146 | 8/1999 |
| JP | 11 231805 | 8/1999 |
| JP | 11-282419 | 10/1999 |
| JP | 2000-056847 | 2/2000 |
| JP | 2000-81607 | 3/2000 |
| JP | 2001-134217 | 5/2001 |
| JP | 2001-195014 | 7/2001 |
| JP | 2002-055654 | 2/2002 |
| JP | 2002-91376 | 3/2002 |
| JP | 2002-514320 | 5/2002 |
| JP | 2002-278513 | 9/2002 |
| JP | 2002-333862 | 11/2002 |
| JP | 2003-076331 | 3/2003 |
| JP | 2003-124519 | 4/2003 |
| JP | 2003-177709 | 6/2003 |
| JP | 2003-271095 | 9/2003 |
| JP | 2003-308046 | 10/2003 |
| JP | 2003-317944 | 11/2003 |
| JP | 2004-004675 | 1/2004 |
| JP | 2004-145197 | 5/2004 |
| JP | 2004-287345 | 10/2004 |
| JP | 2005-057217 | 3/2005 |
| JP | 2007-065015 | 3/2007 |
| JP | 2008-102335 | 5/2008 |
| JP | 4-158570 | 10/2008 |
| KR | 2004-0100887 | 12/2004 |
| TW | 342486 | 10/1998 |
| TW | 473622 | 1/2002 |
| TW | 485337 | 5/2002 |
| TW | 502233 | 9/2002 |
| TW | 538650 | 6/2003 |
| TW | 1221268 | 9/2004 |
| TW | 1223092 | 11/2004 |
| TW | 200727247 | 7/2007 |
| WO | WO 98/48403 | 10/1998 |
| WO | WO 99/48079 | 9/1999 |

(56) References Cited

FOREIGN PATENT DOCUMENTS

| WO | WO 01/06484 | 1/2001 |
|---|---|---|
| WO | WO 01/27910 A1 | 4/2001 |
| WO | WO 01/63587 A2 | 8/2001 |
| WO | WO 02/067327 A | 8/2002 |
| WO | WO 03/001496 A1 | 1/2003 |
| WO | WO 03/034389 A | 4/2003 |
| WO | WO 03/058594 A1 | 7/2003 |
| WO | WO 03/063124 | 7/2003 |
| WO | WO 03/077231 | 9/2003 |
| WO | WO 2004/003877 | 1/2004 |
| WO | WO 2004/025615 A | 3/2004 |
| WO | WO 2004/034364 | 4/2004 |
| WO | WO 2004/047058 | 6/2004 |
| WO | WO 2004/104975 A1 | 12/2004 |
| WO | WO 2005/022498 | 3/2005 |
| WO | WO 2005/022500 A | 3/2005 |
| WO | WO 2005/029455 | 3/2005 |
| WO | WO 2005/029456 | 3/2005 |
| WO | WO 2005/055185 | 6/2005 |
| WO | WO 2006/000101 A1 | 1/2006 |
| WO | WO 2006/053424 | 5/2006 |
| WO | WO 2006/063448 A | 6/2006 |
| WO | WO 2006/084360 | 8/2006 |
| WO | WO 2007/003877 A | 1/2007 |
| WO | WO 2007/079572 | 7/2007 |
| WO | WO 2007/120849 A2 | 10/2007 |
| WO | WO 2009/048618 | 4/2009 |
| WO | WO 2009/055920 | 5/2009 |
| WO | WO 2010/023270 | 3/2010 |
| WO | WO 2010/146707 A1 | 12/2010 |
| WO | WO 2011/041224 A1 | 4/2011 |
| WO | WO 2011/064761 A1 | 6/2011 |
| WO | WO 2011/067729 | 6/2011 |
| WO | WO 2012/160424 A1 | 11/2012 |
| WO | WO 2012/160471 | 11/2012 |
| WO | WO 2012/164474 A2 | 12/2012 |
| WO | WO 2012/164475 A2 | 12/2012 |

OTHER PUBLICATIONS

Alexander : "Pixel circuits and drive schemes for glass and elastic AMOLED displays"; dated Jul. 2005 (9 pages).
Alexander : "Unique Electrical Measurement Technology for Compensation, Inspection, and Process Diagnostics of AMOLED HDTV"; dated May 2010 (4 pages).
Ashtiani : "AMOLED Pixel Circuit With Electronic Compensation of Luminance Degradation"; dated Mar. 2007 (4 pages).
Chaji : "A Current-Mode Comparator for Digital Calibration of Amorphous Silicon AMOLED Displays"; dated Jul. 2008 (5 pages).
Chaji : "A fast settling current driver based on the CCII for AMOLED displays"; dated Dec. 2009 (6 pages).
Chaji : "A Low-Cost Stable Amorphous Silicon AMOLED Display with Full V~T- and V~O~L~E~D Shift Compensation"; dated May 2007 (4 pages).
Chaji : "A low-power driving scheme for a-Si:H active-matrix organic light-emitting diode displays"; dated Jun. 2005 (4 pages).
Chaji : "A low-power high-performance digital circuit for deep submicron technologies"; dated Jun. 2005 (4 pages).
Chaji : "A novel a-Si:H AMOLED pixel circuit based on short-term stress stability of a-Si:H TFTs"; dated Oct. 2005 (3 pages).
Chaji : "A Novel Driving Scheme and Pixel Circuit for AMOLED Displays"; dated Jun. 2006 (4 pages).
Chaji : "A Novel Driving Scheme for High Resolution Large-area a-SI:H AMOLED displays"; dated Aug. 2005 (3 pages).
Chaji : "A Stable Voltage-Programmed Pixel Circuit for a-Si:H AMOLED Displays"; dated Dec. 2006 (12 pages).
Chaji : "A Sub-μA fast-settling current-programmed pixel circuit for AMOLED displays"; dated Sep. 2007.
Chaji : "An Enhanced and Simplified Optical Feedback Pixel Circuit for AMOLED Displays"; dated Oct. 2006.
Chaji : "Compensation technique for DC and transient instability of thin film transistor circuits for large-area devices"; dated Aug. 2008.
Chaji : "Driving scheme for stable operation of 2-TFT a-Si AMOLED pixel"; dated Apr. 2005 (2 pages).
Chaji : "Dynamic-effect compensating technique for stable a-Si:H AMOLED displays"; dated Aug. 2005 (4 pages).
Chaji : "Electrical Compensation of OLED Luminance Degradation"; dated Dec. 2007 (3 pages).
Chaji : "eUTDSP: a design study of a new VLIW-based DSP architecture"; dated My 2003 (4 pages).
Chaji : "Fast and Offset-Leakage Insensitive Current-Mode Line Driver for Active Matrix Displays and Sensors"; dated Feb. 2009 (8 pages).
Chaji : "High Speed Low Power Adder Design With a New Logic Style: Pseudo Dynamic Logic (SDL)"; dated Oct. 2001 (4 pages).
Chaji : "High-precision, fast current source for large-area current-programmed a-Si flat panels"; dated Sep. 2006 (4 pages).
Chaji : "Low-Cost AMOLED Television with Ignis Compensating Technology"; dated May 2008 (4 pages).
Chaji : "Low-Cost Stable a-Si:H AMOLED Display for Portable Applications"; dated Jun. 2006 (4 pages).
Chaji : "Low-Power Low-Cost Voltage-Programmed a-Si:H AMOLED Display"; dated Jun. 2008 (5 pages).
Chaji : "Merged phototransistor pixel with enhanced near infrared response and flicker noise reduction for biomolecular imaging"; dated Nov. 2008 (3 pages).
Chaji : "Parallel Addressing Scheme for Voltage-Programmed Active-Matrix OLED Displays"; dated May 2007 (6 pages).
Chaji : "Pseudo dynamic logic (SDL): a high-speed and low-power dynamic logic family"; dated 2002 (4 pages).
Chaji : "Stable a-Si:H circuits based on short-term stress stability of amorphous silicon thin film transistors"; dated May 2006 (4 pages).
Chaji : "Stable Pixel Circuit for Small-Area High-Resolution a-Si:H AMOLED Displays"; dated Oct. 2008 (6 pages).
Chaji : "Stable RGBW AMOLED display with OLED degradation compensation using electrical feedback"; dated Feb. 2010 (2 pages).
Chaji : "Thin-Film Transistor Integration for Biomedical Imaging and AMOLED Displays"; dated 2008 (177 pages).
European Search Report for Application No. EP 04 78 6661 dated Mar. 9, 2009.
European Search Report for Application No. EP 05 75 9141 dated Oct. 30, 2009 (2 pages).
European Search Report for Application No. EP 05 81 9617 dated Jan. 30, 2009.
European Search Report for Application No. EP 06 70 5133 dated Jul. 18, 2008.
European Search Report for Application No. EP 06 72 1798 dated Nov. 12, 2009 (2 pages).
European Search Report for Application No. EP 07 71 0608.6 dated Mar. 19, 2010 (7 pages).
European Search Report for Application No. EP 07 71 9579 dated May 20, 2009.
European Search Report for Application No. EP 07 81 5784 dated Jul. 20, 2010 (2 pages).
European Search Report for Application No. EP 10 16 6143, dated Sep. 3, 2010 (2 pages).
European Search Report for Application No. EP 10 83 4294.0-1903, dated Apr. 8, 2013, (9 pages).
European Supplementary Search Report for Application No. EP 04 78 6662 dated Jan. 19, 2007 (2 pages).
Extended European Search Report for Application No. 11 73 9485.8 mailed Aug. 6, 2013(14 pages).
Extended European Search Report for Application No. EP 09 73 3076.5, mailed Apr. 27, (13 pages).
Extended European Search Report for Application No. EP 11 16 8677.0, mailed Nov. 29, 2012, (13 page).
Extended European Search Report for Application No. EP 11 19 1641.7 mailed Jul. 11, 2012 (14 pages).
Extended European Search Report for Application No. EP 10834297 mailed Oct. 27, 2014 (6 pages).
Fossum, Eric R.. "Active Pixel Sensors: Are CCD's Dinosaurs?" SPIE: Symposium on Electronic Imaging. Feb. 1, 1993 (13 pages).
Goh , "A New a-Si:H Thin-Film Transistor Pixel Circuit for Active-Matrix Organic Light-Emitting Diodes", IEEE Electron Device Letters, vol. 24, No. 9, Sep. 2003, pp. 583-585.

(56) References Cited

OTHER PUBLICATIONS

International Preliminary Report on Patentability for Application No. PCT/CA2005/001007 dated Oct. 16, 2006, 4 pages.
International Search Report for Application No. PCT/CA2004/001741 dated Feb. 21, 2005.
International Search Report for Application No. PCT/CA2004/001742, Canadian Patent Office, dated Feb. 21, 2005 (2 pages).
International Search Report for Application No. PCT/CA2005/001007 dated Oct. 18, 2005.
International Search Report for Application No. PCT/CA2005/001897, mailed Mar. 21, 2006 (2 pages).
International Search Report for Application No. PCT/CA2007/000652 dated Jul. 25, 2007.
International Search Report for Application No. PCT/CA2009/000501, mailed Jul. 30, 2009 (4 pages).
International Search Report for Application No. PCT/CA2009/001769, dated Apr. 8, 2010 (3 pages).
International Search Report for Application No. PCT/IB2010/055481, dated Apr. 7, 2011, 3 pages.
International Search Report for Application No. PCT/IB2010/055486, Dated Apr. 19, 2011, 5 pages.
International Search Report for Application No. PCT/IB2014/060959, Dated Aug. 28, 2014, 5 pages.
International Search Report for Application No. PCT/IB2010/055541 filed Dec. 1, 2010, dated May 26, 2011; 5 pages.
International Search Report for Application No. PCT/IB2011/050502, dated Jun. 27, 2011 (6 pages).
International Search Report for Application No. PCT/IB2011/051103, dated Jul. 8, 2011, 3 pages.
International Search Report for Application No. PCT/IB2011/055135, Canadian Patent Office, dated Apr. 16, 2012 (5 pages).
International Search Report for Application No. PCT/IB2012/052372, mailed Sep. 12, 2012 (3 pages).
International Search Report for Application No. PCT/IB2013/054251, Canadian Intellectual Property Office, dated Sep. 11, 2013; (4 pages).
International Search Report for Application No. PCT/JP02/09668, mailed Dec. 3, 2002, (4 pages).
International Written Opinion for Application No. PCT/CA2004/001742, Canadian Patent Office, dated Feb. 21, 2005 (5 pages).
International Written Opinion for Application No. PCT/CA2005/001897, mailed Mar. 21, 2006 (4 pages).
International Written Opinion for Application No. PCT/CA2009/000501 mailed Jul. 30, 2009 (6 pages).
International Written Opinion for Application No. PCT/IB2010/055481, dated Apr. 7, 2011, 6 pages.
International Written Opinion for Application No. PCT/IB2010/055486, Dated Apr. 19, 2011, 8 pages.
International Written Opinion for Application No. PCT/IB2010/055541, dated May 26, 2011; 6 pages.
International Written Opinion for Application No. PCT/IB2011/050502, dated Jun. 27, 2011 (7 pages).
International Written Opinion for Application No. PCT/IB2011/051103, dated Jul. 8, 2011, 6 pages.
International Written Opinion for Application No. PCT/IB2011/055135, Canadian Patent Office, dated Apr. 16, 2012 (5 pages).
International Written Opinion for Application No. PCT/IB2012/052372, mailed Sep. 12, 2012 (6 pages).
International Written Opinion for Application No. PCT/IB2013/054251, Canadian Intellectual Property Office, dated Sep. 11, 2013; (5 pages).
Jafarabadiashtiani : "A New Driving Method for a-Si AMOLED Displays Based on Voltage Feedback"; dated 2005 (4 pages).
Kanicki, J., "Amorphous Silicon Thin-Film Transistors Based Active-Matrix Organic Light-Emitting Displays." Asia Display: International Display Workshops, Sep. 2001 (pp. 315-318).
Karim, K. S., "Amorphous Silicon Active Pixel Sensor Readout Circuit for Digital Imaging." IEEE: Transactions on Electron Devices. vol. 50, No. 1, Jan. 2003 (pp. 200-208).
Lee : "Ambipolar Thin-Film Transistors Fabricated by PECVD Nanocrystalline Silicon"; dated 2006.
Lee, Wonbok: "Thermal Management in Microprocessor Chips and Dynamic Backlight Control in Liquid Crystal Displays", Ph.D. Dissertation, University of Southern California (124 pages).
Liu, P. et al., Innovative Voltage Driving Pixel Circuit Using Organic Thin-Film Transistor for AMOLEDs, Journal of Display Technology, vol. 5, Issue 6, Jun. 2009 (pp. 224-227).
Ma E Y: "organic light emitting diode/thin film transistor integration for foldable displays" dated Sep. 15, 1997(4 pages).
Matsueda y : "35.1: 2.5-in. AMOLED with Integrated 6-bit Gamma Compensated Digital Data Driver"; dated May 2004.
Mendes E., "A High Resolution Switch-Current Memory Base Cell." IEEE: Circuits and Systems. vol. 2, Aug. 1999 (pp. 718-721).
Nathan A. , "Thin Film imaging technology on glass and plastic" ICM 2000, proceedings of the 12 international conference on microelectronics, dated Oct. 31, 2001 (4 pages).
Nathan , "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Nathan : "Backplane Requirements for active Matrix Organic Light Emitting Diode Displays,"; dated 2006 (16 pages).
Nathan : "Call for papers second international workshop on compact thin-film transistor (TFT) modeling for circuit simulation"; dated Sep. 2009 (1 page).
Nathan : "Driving schemes for a-Si and LTPS AMOLED displays"; dated Dec. 2005 (11 pages).
Nathan : "Invited Paper: a-Si for AMOLED—Meeting the Performance and Cost Demands of Display Applications (Cell Phone to HDTV)", dated 2006 (4 pages).
Office Action in Japanese patent application No. JP2012-541612 dated Jul. 15, 2014. (3 pages).
Partial European Search Report for Application No. EP 11 168 677.0, mailed Sep. 22, 2011 (5 pages).
Partial European Search Report for Application No. EP 11 19 1641.7, mailed Mar. 20, 2012 (8 pages).
Philipp: "Charge transfer sensing" Sensor Review, vol. 19, No. 2, Dec. 31, 1999, 10 pages.
Rafati : "Comparison of a 17 b multiplier in Dual-rail domino and in Dual-rail D L (D L) logic styles"; dated 2002 (4 pages).
Safavian : "3-TFT active pixel sensor with correlated double sampling readout circuit for real-time medical x-ray imaging"; dated Jun. 2006 (4 pages).
Safavian : "A novel current scaling active pixel sensor with correlated double sampling readout circuit for real time medical x-ray imaging"; dated May 2007 (7 pages).
Safavian : "A novel hybrid active-passive pixel with correlated double sampling CMOS readout circuit for medical x-ray imaging"; dated May 2008 (4 pages).
Safavian : "Self-compensated a-Si:H detector with current-mode readout circuit for digital X-ray fluoroscopy"; dated Aug. 2005 (4 pages).
Safavian : "TFT active image sensor with current-mode readout circuit for digital x-ray fluoroscopy [5969D-82]"; dated Sep. 2005 (9 pages).
Safavian : "Three-TFT image sensor for real-time digital X-ray imaging"; dated Feb. 2, 2006 (2 pages).
Singh, , "Current Conveyor: Novel Universal Active Block", Samriddhi, S-JPSET vol. I, Issue 1, 2010, pp. 41-48 (12EPPT).
Smith, Lindsay I., "A tutorial on Principal Components Analysis," dated Feb. 26, 2001 (27 pages).
Spindler , System Considerations for RGBW OLED Displays, Journal of the SID 14/1, 2006, pp. 37-48.
Stewart M. , "polysilicon TFT technology for active matrix oled displays" IEEE transactions on electron devices, vol. 48, No. 5, dated May 2001 (7 pages).
Vygranenko : "Stability of indium—oxide thin-film transistors by reactive ion beam assisted deposition"; dated 2009.
Wang : "Indium oxides by reactive ion beam assisted evaporation: From material study to device application"; dated Mar. 2009 (6 pages).
Yi He , "Current-Source a-Si:H Thin Film Transistor Circuit for Active-Matrix Organic Light-Emitting Displays", IEEE Electron Device Letters, vol. 21, No. 12, Dec. 2000, pp. 590-592.

(56) References Cited

OTHER PUBLICATIONS

Yu, Jennifer: "Improve OLED Technology for Display", Ph.D. Dissertation, Massachusetts Institute of Technology, Sep. 2008 (151 pages).
International Search Report for Application No. PCT/IB2014/058244, Canadian Intellectual Property Office, dated Apr. 11, 2014; (6 pages).
International Search Report for Application No. PCT/IB2014/059753, Canadian Intellectual Property Office, dated Jun. 23, 2014; (6 pages).
Written Opinion for Application No. PCT/IB2014/059753, Canadian Intellectual Property Office, dated Jun. 12, 2014 (6 pages).
International Search Report for Application No. PCT/IB2014/060879, Canadian Intellectual Property Office, dated Jul. 17, 2014 (3 pages).
Extended European Search Report for Application No. EP 14158051.4, mailed Jul. 29, 2014, (4 pages).
Office Action in Chinese Patent Invention No. 201180008188.9, dated Jun. 4, 2014 (17 pages) (w/English translation).
International Search Report for Application No. PCT/IB/2014/066932 dated Mar. 24, 2015.
Written Opinion for Application No. PCT/IB/2014/066932 dated Mar. 24, 2015.
Extended European Search Report for Application No. EP 11866291.5, mailed Mar. 9, 2015, (9 pages).
Extended European Search Report for Application No. EP 14181848.4, mailed Mar. 5, 2015, (8 pages).
Office Action in Chinese Patent Invention No. 201280022957.5, dated Jun. 26, 2015 (7 pages).

* cited by examiner

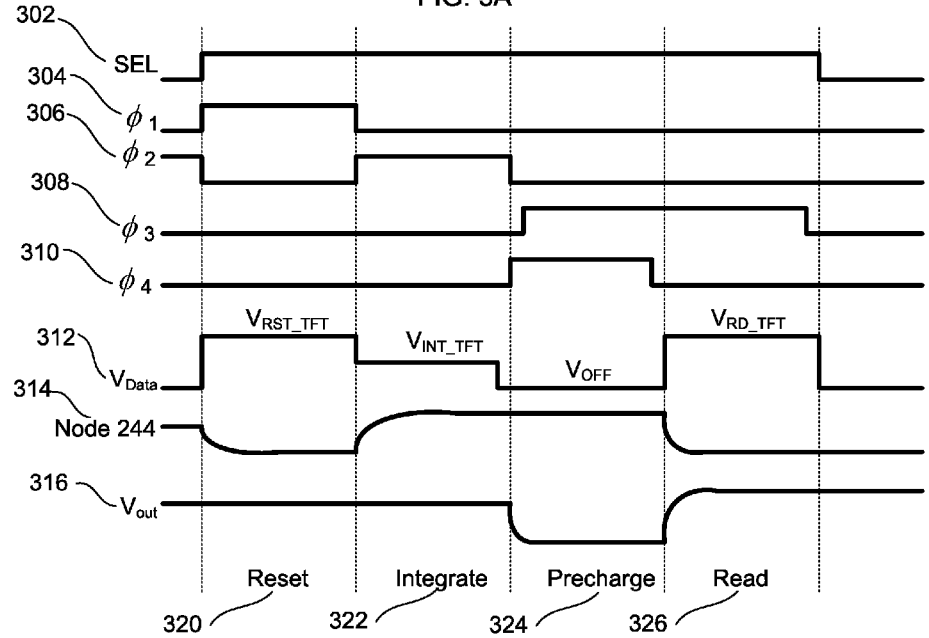
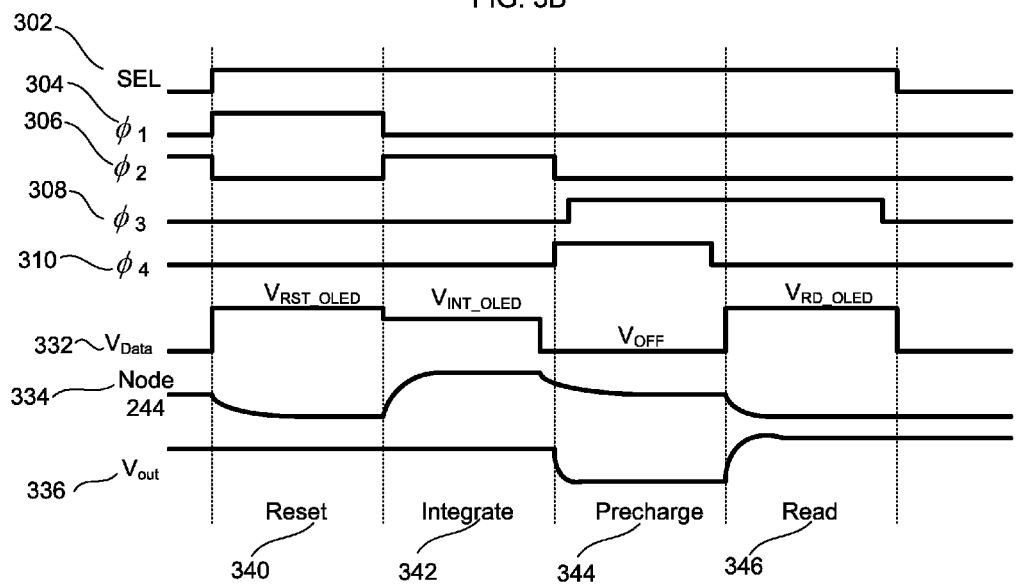

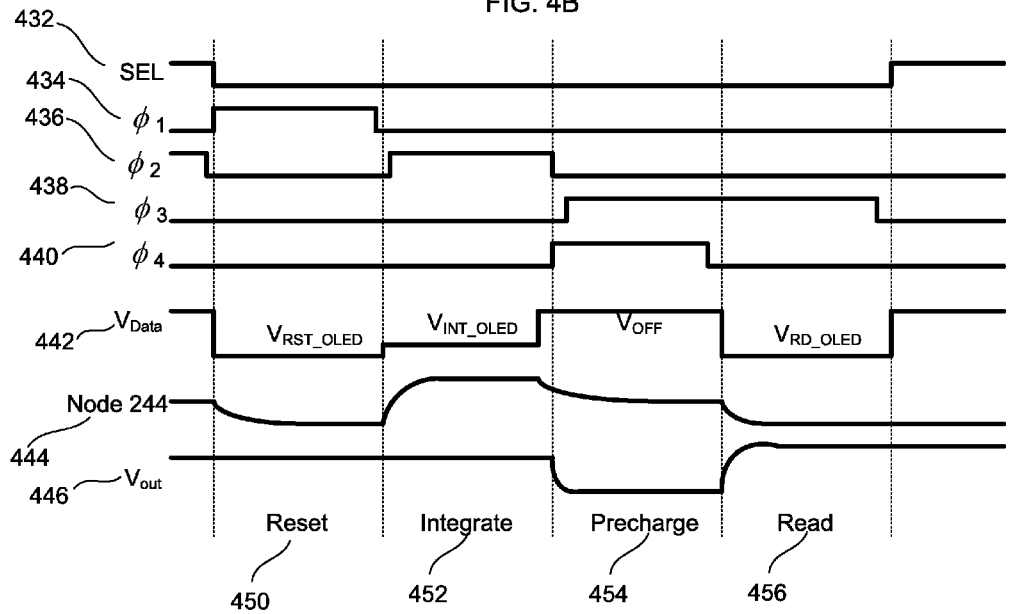
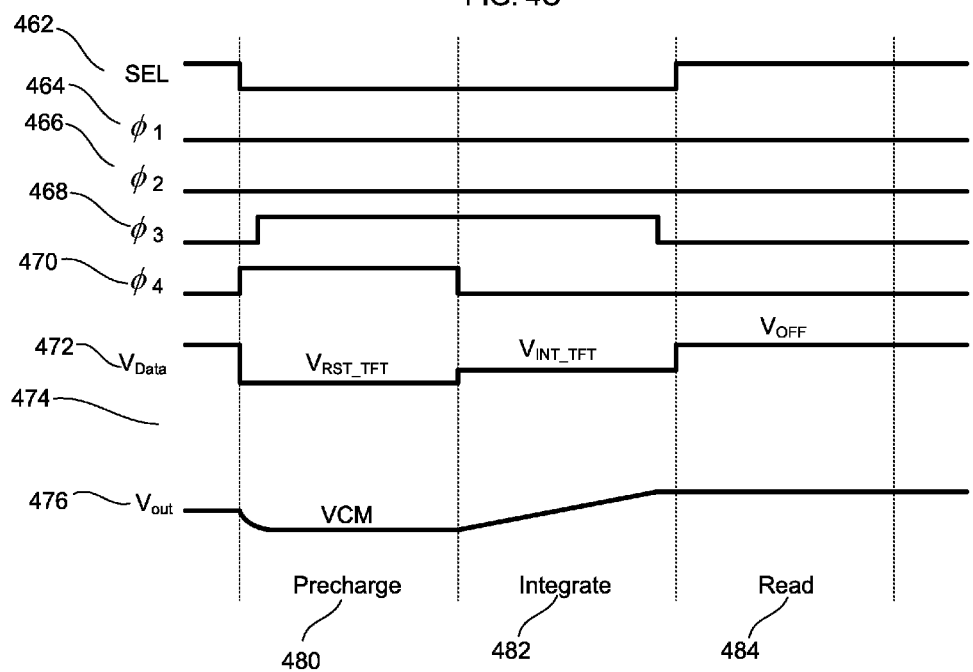

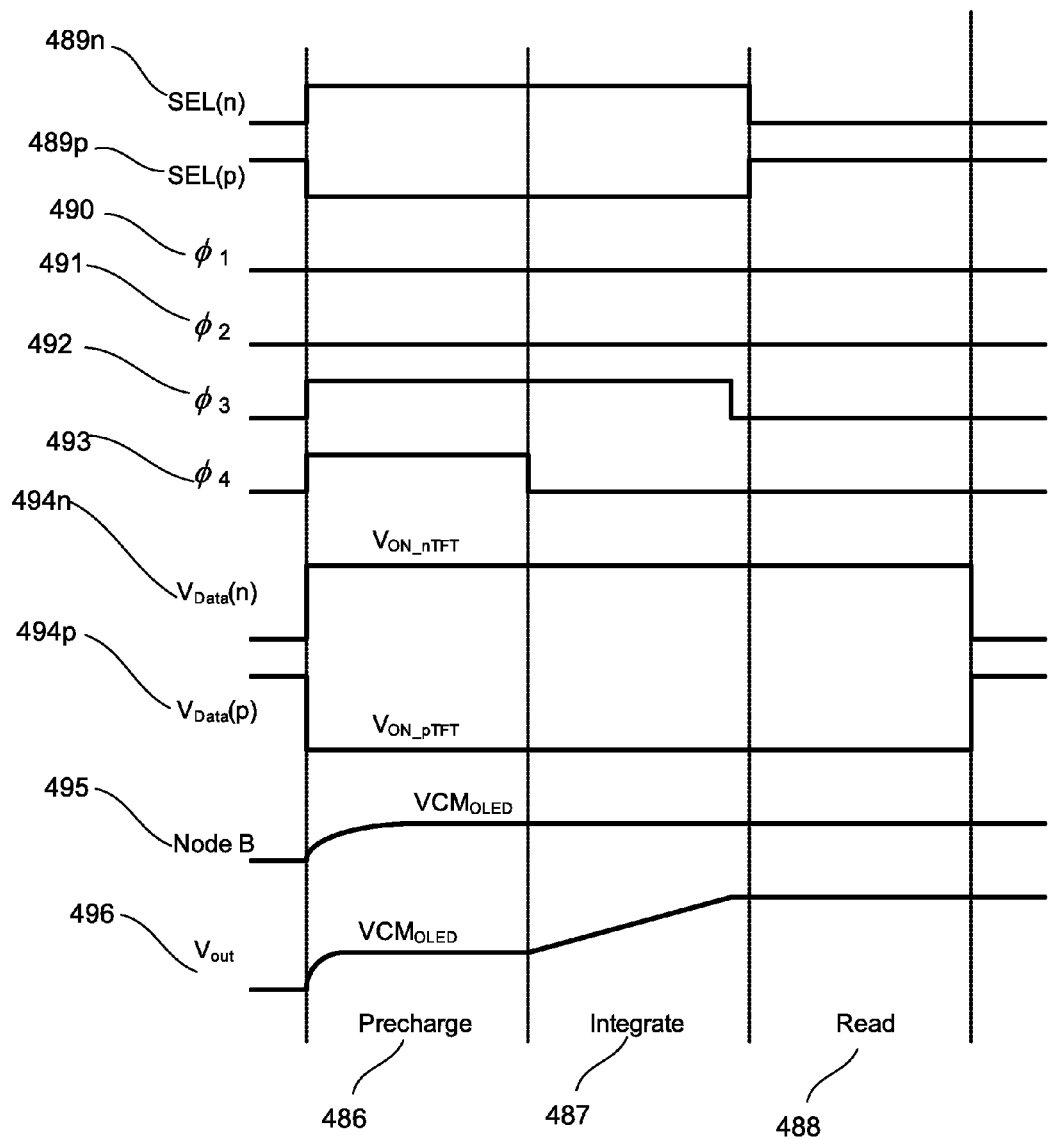

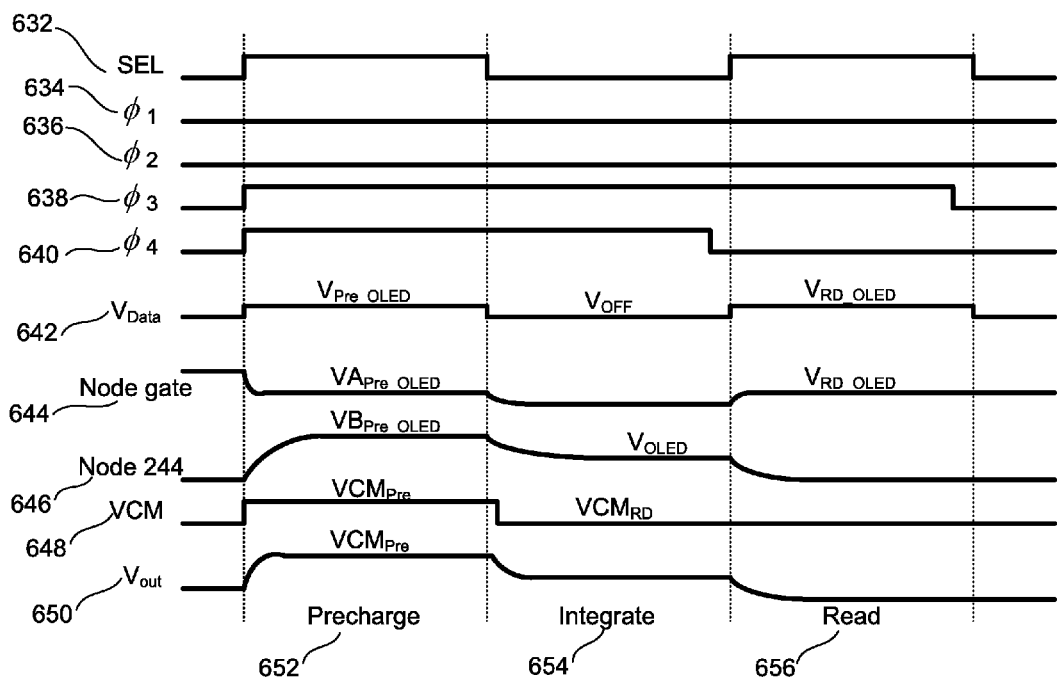
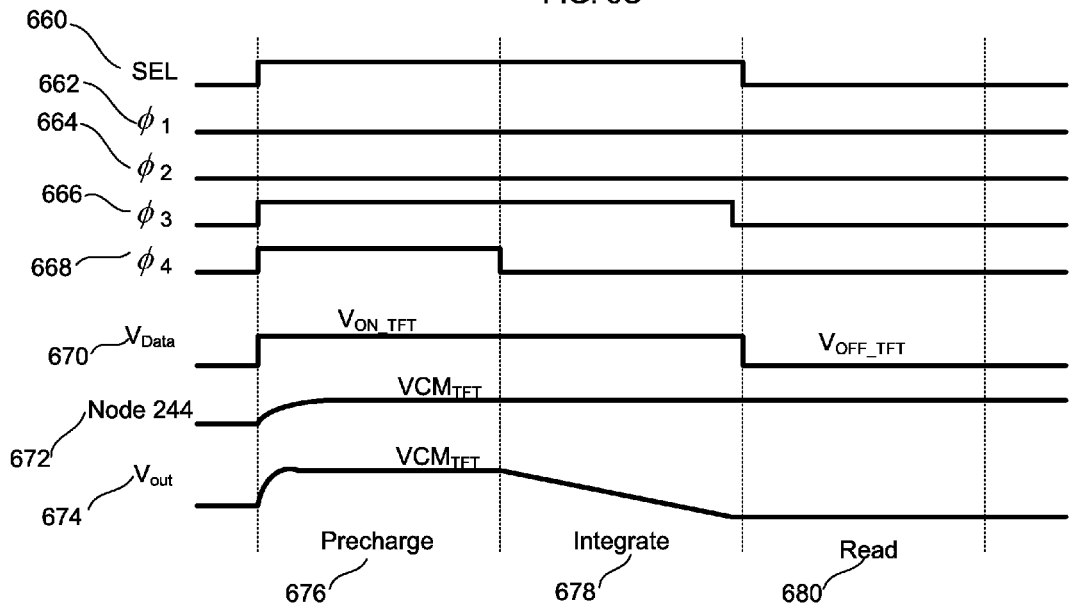

SYSTEM AND METHODS FOR EXTRACTION OF THRESHOLD AND MOBILITY PARAMETERS IN AMOLED DISPLAYS

CROSS REFERENCE TO RELATED APPLICATIONS

This application is a continuation of, and claims priority to, U.S. patent application Ser. No. 13/950,795, filed Jul. 25, 2013, which is a continuation of U.S. patent application Ser. No. 13/112,468, filed May 20, 2011, now U.S. Pat. No. 8,476, 217, each of which is hereby incorporated by reference herein in its entirety.

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention generally relates to active matrix organic light emitting device (AMOLED) displays, and particularly extracting threshold and mobility factors from the pixel drivers for such displays.

BACKGROUND

Currently, active matrix organic light emitting device ("AMOLED") displays are being introduced. The advantages of such displays include lower power consumption, manufacturing flexibility and faster refresh rate over conventional liquid crystal displays. In contrast to conventional liquid crystal displays, there is no backlighting in an AMOLED display, and thus each pixel consists of different colored OLEDs emitting light independently. The OLEDs emit light based on current supplied through a drive transistor controlled by a programming voltage. The power consumed in each pixel has a relation with the magnitude of the generated light in that pixel.

The quality of output in an OLED based pixel is affected by the properties of the drive transistor, which is typically fabricated from materials including but not limited to amorphous silicon, polysilicon, or metal oxide, as well as the OLED itself. In particular, threshold voltage and mobility of the drive transistor tend to change as the pixel ages. In order to maintain image quality, changes in these parameters must be compensated for by adjusting the programming voltage. In order to do so, such parameters must be extracted from the driver circuit. The addition of components to extract such parameters in a simple driver circuit requires more space on a display substrate for the drive circuitry and thereby reduces the amount of aperture or area of light emission from the OLED.

When biased in saturation, the I-V characteristic of a thin film drive transistor depends on mobility and threshold voltage which are a function of the materials used to fabricate the transistor. Thus different thin film transistor devices implemented across the display panel may demonstrate non-uniform behavior due to aging and process variations in mobility and threshold voltage. Accordingly, for a constant voltage, each device may have a different drain current. An extreme example may be where one device could have low threshold-voltage and low mobility compared to a second device with high threshold-voltage and high mobility.

Thus with very few electronic components available to maintain a desired aperture, extraction of non-uniformity parameters (i.e. threshold voltage, $V_{th}$, and mobility, $\mu$) of the drive TFT and the OLED becomes challenging. It would be desirable to extract such parameters in a driver circuit for an OLED pixel with as few components as possible to maximize pixel aperture.

SUMMARY

One example disclosed is a data extraction system for an organic light emitting device (OLED) based display. The system includes a pixel circuit including an organic light emitting device, a drive device to provide a programmable drive current to the light emitting device, a programming input to provide a programming signal, and a storage device to store the programming signal. A charge-pump amplifier has a current input and a voltage output. The charge-pump amplifier includes an operational amplifier in negative feedback configuration. The feedback is provided by a capacitor connected between the output and the inverting input of the operational amplifier. A common-mode voltage source drives the non-inverting input of the operational amplifier. An electronic switch is coupled across the capacitor to reset the capacitor. A switch module including the input is coupled to the output of the pixel circuit and an output is coupled to the input of the charge-pump amplifier. The switch module includes a plurality of electronic switches that may be controlled by external control signals to steer current in and out of the pixel circuit, provide a discharge path between the pixel circuit and the charge-pump amplifier and isolate the charge-pump amplifier from the pixel circuit. A controller is coupled to the pixel circuit, charge-pump amplifier and the switch module. The controller controls input signals to the pixel circuit, charge-pump amplifier and switch module in a predetermined sequence to produce an output voltage value which is a function of a parameter of the pixel circuit. The sequence includes providing a program voltage to the programming input to either pre-charge an internal capacitance of the pixel circuit to a charge level and transfer the charge to the charge-pump amplifier via the switch module to generate the output voltage value or provide a current from the pixel circuit to the charge-pump amplifier via the switch module to produce the output voltage value by integration over a certain period of time.

Another example is a method of extracting a circuit parameter from a pixel circuit including an organic light emitting device, a drive device to provide a programmable drive current to the light emitting device, a programming input, and a storage device to store a programming signal. A predetermined program voltage is provided to the programming voltage input. A capacitance of the pixel circuit is charged to a charge level or a current from the pixel circuit. The pixel circuit is coupled to a charge-pump amplifier. The charge-pump amplifier is isolated from the pixel circuit to provide a voltage output either proportional to the charge level or to integrate the current from the pixel circuit. The voltage output of the charge-pump amplifier is read. At least one pixel circuit parameter is determined from the voltage output of the charge-pump amplifier.

Another example is a data extraction system for an organic light emitting device (OLED) based display. The system includes a pixel circuit having a drive transistor, an organic light emitting device, and a programming input coupled to the gate of the drive transistor. The drive transistor has a source or a drain coupled to the OLED. A charge-pump amplifier has an input and an integrated voltage output. A switch module includes an input coupled to the output of the pixel circuit and an output coupled to the input of the charge-pump amplifier. The switch module includes switches to steer current in and out of the pixel circuit, provide a discharge path between the pixel circuit and the charge-pump amplifier and isolate the charge-pump amplifier from the pixel circuit. A controller is coupled to the pixel circuit, charge-pump amplifier and the switch module. The controller controls voltage inputs to the pixel circuit, charge-pump amplifier and switch module in a predetermined sequence to produce an output voltage value which is a function of a parameter of the pixel circuit. The sequence including providing a program voltage to the programming input to either pre-charge a capacitance of the pixel circuit to a charge level, transfer the charge to the charge-pump amplifier via the switch module to generate the output voltage value or provide a current from the pixel circuit to the charge-pump amplifier via the switch module to produce the output voltage value by integration.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIG. 3A is a signal timing diagram of the signals to the data extraction circuit to extract the threshold voltage and mobility of an n-type drive transistor in FIG. 2;

FIG. 3B is a signal timing diagram of the signals to the data extraction circuit to extract the characteristic voltage of the OLED in FIG. 2 with an n-type drive transistor;

FIG. 4B is a signal timing diagram of the signals to the data extraction circuit to extract the characteristic voltage of the OLED in FIG. 2 with a p-type drive transistor;

FIG. 4C is a signal timing diagram of the signals to the data extraction circuit for a direct read to extract the threshold voltage of a p-type drive transistor in FIG. 2;

FIG. 4D is a signal timing diagram of the signals to the data extraction circuit for a direct read of the OLED turn-on voltage using either an n-type or p-type drive transistor in FIG. 2.

FIG. 6B is a signal timing diagram of the signals to the data extraction circuit to extract the characteristic voltage of the OLED in FIG. 5;

FIG. 6C is a signal timing diagram the signals to the data extraction circuit for a direct read to extract the threshold voltage of the drive transistor in FIG. 5;

Figure 1:
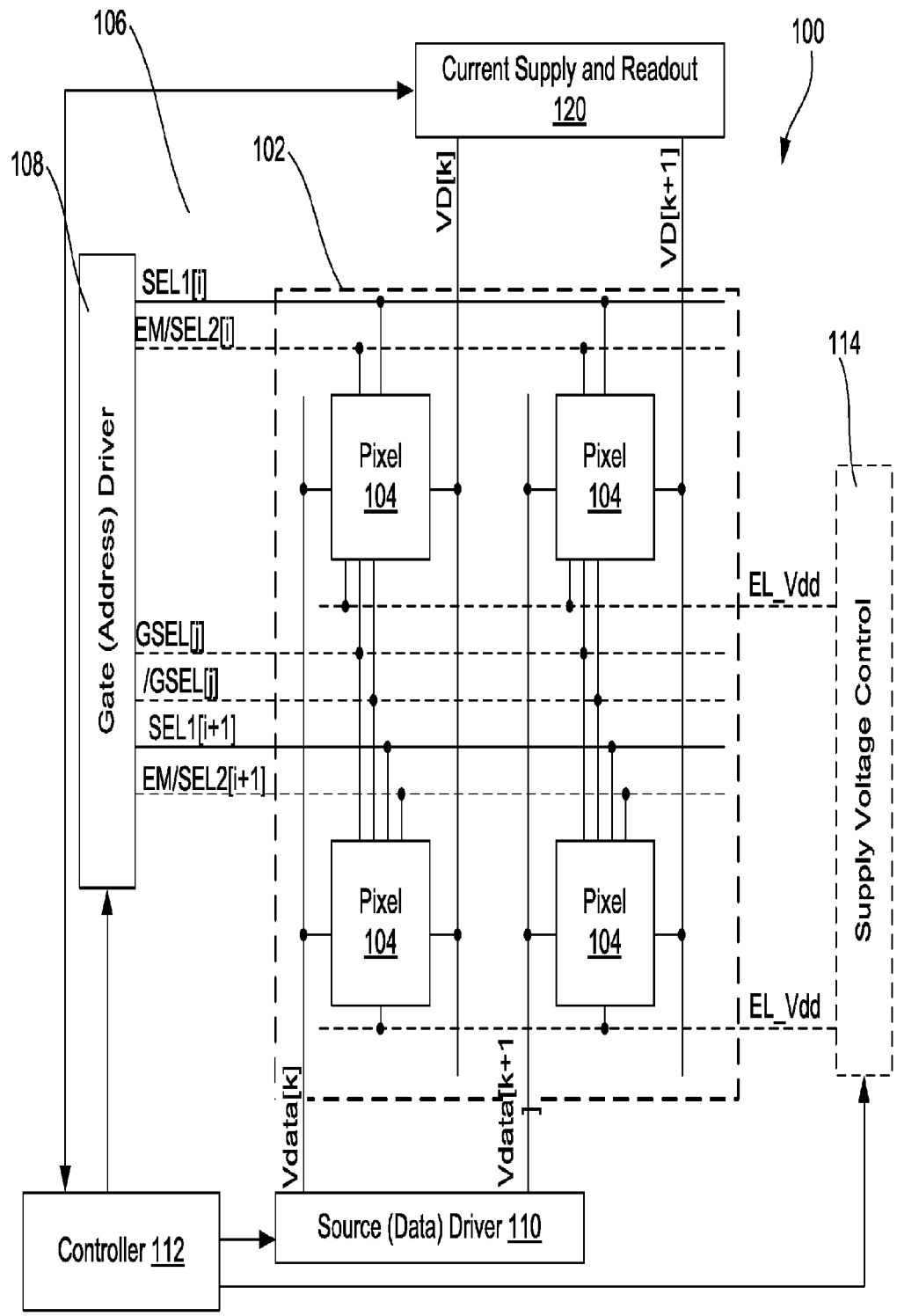
FIG. 1 is a block diagram of an AMOLED display with compensation control.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1 is an electronic display system 100 having an active matrix area or pixel array 102 in which an n×m array of pixels 104 are arranged in a row and column configuration. For ease of illustration, only two rows and two columns are shown. External to the active matrix area of the pixel array 102 is a peripheral area 106 where peripheral circuitry for driving and controlling the pixel array 102 are disposed. The peripheral circuitry includes an address or gate driver circuit 108, a data or source driver circuit 110, a controller 112, and an optional supply voltage (e.g., Vdd) driver 114. The controller 112 controls the gate, source, and supply voltage drivers 108, 110, 114. The gate driver 108, under control of the controller 112, operates on address or select lines SEL[i], SEL[i+1], and so forth, one for each row of pixels 104 in the pixel array 102. In pixel sharing configurations described below, the gate or address driver circuit 108 can also optionally operate on global select lines GSEL[j] and optionally/GSEL[j], which operate on multiple rows of pixels 104 in the pixel array 102, such as every two rows of pixels 104. The source driver circuit 110, under control of the controller 112, operates on voltage data lines Vdata[k], Vdata[k+1], and so forth, one for each column of pixels 104 in the pixel array 102. The voltage data lines carry voltage programming information to each pixel 104 indicative of the brightness of each light emitting device in the pixel 104. A storage element, such as a capacitor, in each pixel 104 stores the voltage programming information until an emission or driving cycle turns on the light emitting device. The optional supply voltage driver 114, under control of the controller 112, controls a supply voltage (EL_Vdd) line, one for each row or column of pixels 104 in the pixel array 102.

The display system 100 further includes a current supply and readout circuit 120, which reads output data from data output lines, VD [k], VD [k+1], and so forth, one for each column of pixels 104 in the pixel array 102.

As is known, each pixel 104 in the display system 100 needs to be programmed with information indicating the brightness of the light emitting device in the pixel 104. A frame defines the time period that includes: (i) a programming cycle or phase during which each and every pixel in the display system 100 is programmed with a programming voltage indicative of a brightness; and (ii) a driving or emission cycle or phase during which each light emitting device in each pixel is turned on to emit light at a brightness commensurate with the programming voltage stored in a storage element. A frame is thus one of many still images that compose a complete moving picture displayed on the display system 100. There are at least schemes for programming and driving the pixels: row-by-row, or frame-by-frame. In row-by-row programming, a row of pixels is programmed and then driven before the next row of pixels is programmed and driven. In frame-by-frame programming, all rows of pixels in the display system 100 are programmed first, and all rows of pixels are driven at once. Either scheme can employ a brief vertical blanking time at the beginning or end of each frame during which the pixels are neither programmed nor driven.

The components located outside of the pixel array 102 may be disposed in a peripheral area 106 around the pixel array 102 on the same physical substrate on which the pixel array 102 is disposed. These components include the gate driver 108, the source driver 110, the optional supply voltage driver 114, and a current supply and readout circuit 120. Alternately, some of the components in the peripheral area 106 may be disposed on the same substrate as the pixel array 102 while other components are disposed on a different substrate, or all of the components in the peripheral area can be disposed on a substrate different from the substrate on which the pixel array 102 is disposed. Together, the gate driver 108, the source driver 110, and the supply voltage driver 114 make up a display driver circuit. The display driver circuit in some configurations can include the gate driver 108 and the source driver 110 but not the supply voltage control 114.

When biased in saturation, the first order I-V characteristic of a metal oxide semiconductor (MOS) transistor (a thin film transistor in this case of interest) is modeled as:

$$I_D = \frac{1}{2}\mu C_{ox}\frac{W}{L}(V_{GS} - V_{th})^2$$

where $I_D$ is the drain current and $V_{GS}$ is the voltage difference applied between gate and source terminals of the transistor. The thin film transistor devices implemented across the display system 100 demonstrate non-uniform behavior due to aging and process variations in mobility (μ) and threshold voltage ($V_{th}$). Accordingly, for a constant voltage difference applied between gate and source, $V_{GS}$, each transistor on the pixel matrix 102 may have a different drain current based on a non-deterministic mobility and threshold voltage:

$$I_{D(i,j)}=f(\mu_{i,j}, V_{th\,i,j})$$

where i and j are the coordinates (row and column) of a pixel in an n×m array of pixels such as the array of pixels 102 in FIG. 1.

Figure 2:
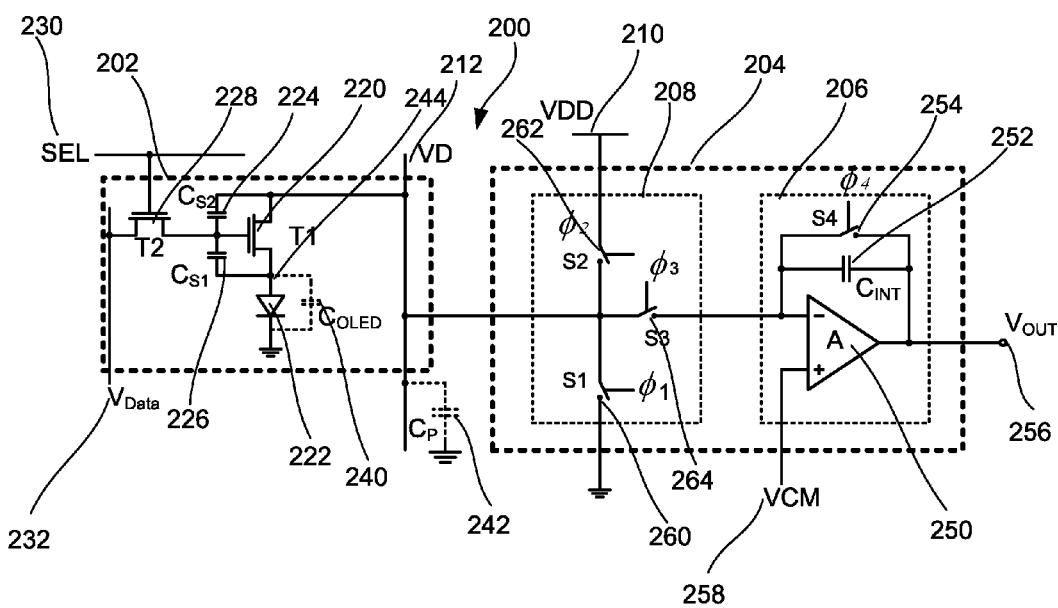
FIG. 2 is a circuit diagram of a data extraction circuit for a two-transistor pixel in the AMOLED display in FIG. 1.

FIG. 2 shows a data extraction system 200 including a two-transistor (2T) driver circuit 202 and a readout circuit 204. The supply voltage control 114 is optional in a display system with 2T pixel circuit 104. The readout circuit 204 is part of the current supply and readout circuit 120 and gathers data from a column of pixels 104 as shown in FIG. 1. The readout circuit 204 includes a charge pump circuit 206 and a switch-box circuit 208. A voltage source 210 provides the supply voltage to the driver circuit 202 through the switch-box circuit 208. The charge-pump and switch-box circuits 206 and 208 are implemented on the top or bottom side of the array 102 such as in the voltage drive 114 and the current supply and readout circuit 120 in FIG. 1. This is achieved by either direct fabrication on the same substrate as the pixel array 102 or by bonding a microchip on the substrate or a flex as a hybrid solution.

The driver circuit 202 includes a drive transistor 220, an organic light emitting device 222, a drain storage capacitor 224, a source storage capacitor 226, and a select transistor 228. A supply line 212 provides the supply voltage and also a monitor path (for the readout circuit 204) to a column of driver circuits such as the driver circuit 202. A select line input 230 is coupled to the gate of the select transistor 228. A programming data input 232 is coupled to the gate of the drive transistor 220 through the select transistor 228. The drain of the drive transistor 220 is coupled to the supply voltage line 212 and the source of the drive transistor 220 is coupled to the OLED 222. The select transistor 228 controls the coupling of the programming input 230 to the gate of the drive transistor 220. The source storage capacitor 226 is coupled between the gate and the source of the drive transistor 220. The drain storage capacitor 224 is coupled between the gate and the drain of the drive transistor 220. The OLED 222 has a parasitic capacitance that is modeled as a capacitor 240. The supply voltage line 212 also has a parasitic capacitance that is modeled as a capacitor 242. The drive transistor 220 in this example is a thin film transistor that is fabricated from amorphous silicon. Of course other materials such as polysilicon or metal oxide may be used. A node 244 is the circuit node where the source of the drive transistor 220 and the anode of the OLED 222 are coupled together. In this example, the drive transistor 220 is an n-type transistor. The system 200 may be used with a p-type drive transistor in place of the n-type drive transistor 220 as will be explained below.

The readout circuit 204 includes the charge-pump circuit 206 and the switch-box circuit 208. The charge-pump circuit 206 includes an amplifier 250 having a positive and negative input. The negative input of the amplifier 250 is coupled to a capacitor 252 ($C_{int}$) in parallel with a switch 254 in a negative feedback loop to an output 256 of the amplifier 250. The switch 254 (S4) is utilized to discharge the capacitor 252 $C_{int}$ during the pre-charge phase. The positive input of the amplifier 250 is coupled to a common mode voltage input 258 (VCM). The output 256 of the amplifier 250 is indicative of various extracted parameters of the drive transistor 220 and OLED 222 as will be explained below.

The switch-box circuit 208 includes several switches 260, 262 and 264 (S1, S2 and S3) to steer current to and from the pixel driver circuit 202. The switch 260 (S1) is used during the reset phase to provide a discharge path to ground. The switch 262 (S2) provides the supply connection during normal operation of the pixel 104 and also during the integration phase of readout. The switch 264 (S3) is used to isolate the charge-pump circuit 206 from the supply line voltage 212 (VD).

The general readout concept for the two transistor pixel driver circuit 202 for each of the pixels 104, as shown in FIG. 2, comes from the fact that the charge stored on the parasitic capacitance represented by the capacitor 240 across the OLED 222 has useful information of the threshold voltage and mobility of the drive transistor 220 and the turn-on voltage of the OLED 222. The extraction of such parameters may be used for various applications. For example, such parameters may be used to modify the programming data for the pixels 104 to compensate for pixel variations and maintain image quality. Such parameters may also be used to pre-age the pixel array 102. The parameters may also be used to evaluate the process yield for the fabrication of the pixel array 102.

Assuming that the capacitor 240 ($C_{OLED}$) is initially discharged, it takes some time for the capacitor 240 ($C_{OLED}$) to charge up to a voltage level that turns the drive transistor 220 off. This voltage level is a function of the threshold voltage of the drive transistor 220. The voltage applied to the programming data input 232 ($V_{Data}$) must be low enough such that the settled voltage of the OLED 222 ($V_{OLED}$) is less than the turn-on threshold voltage of the OLED 222 itself. In this condition, $V_{Data}$-$V_{OLED}$ is a linear function of the threshold voltage ($V_{th}$) of the drive transistor 220. In order to extract the mobility of a thin film transistor device such as the drive transistor 220, the transient settling of such devices, which is a function of both the threshold voltage and mobility, is considered. Assuming that the threshold voltage deviation among the TFT devices such as the drive transistor 220 is compensated, the voltage of the node 244 sampled at a constant interval after the beginning of integration is a function of mobility only of the TFT device such as the drive transistor 220 of interest.

Figure 3C:
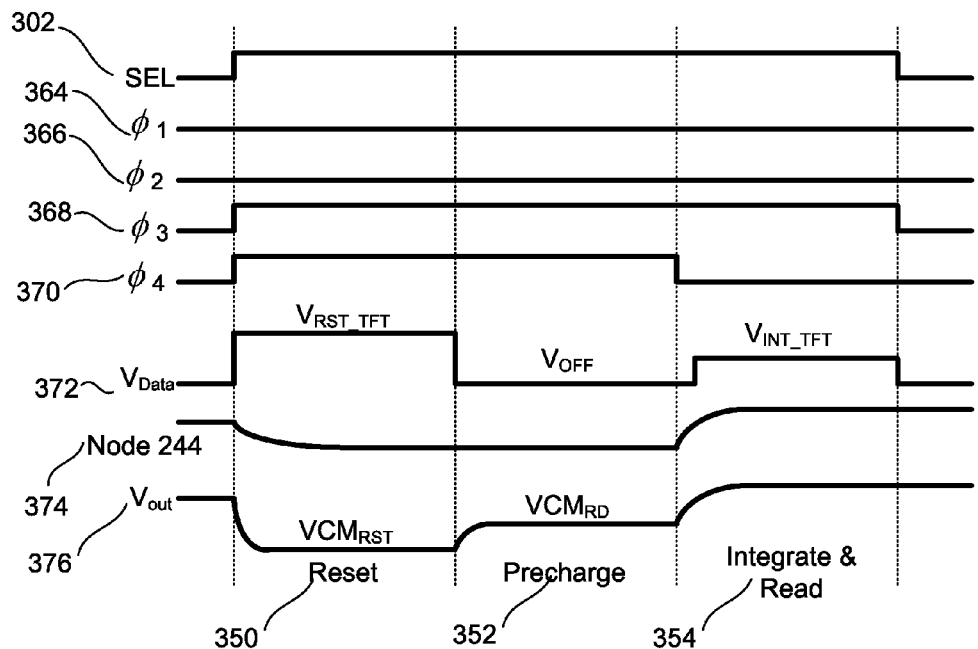
FIG. 3C is a signal timing diagram of the signals to the data extraction circuit for a direct read to extract the threshold voltage of an n-type drive transistor in FIG. 2.

FIG. 3A-3C are signal timing diagrams of the control signals applied to the components in FIG. 2 to extract parameters such as voltage threshold and mobility from the drive transistor 220 and the turn on voltage of the OLED 222 in the drive circuit 200 assuming the drive transistor 220 is an n-type transistor. Such control signals could be applied by the controller 112 to the source driver 110, the gate driver 108 and the current supply and readout circuit 120 in FIG. 1. FIG. 3A is a timing diagram showing the signals applied to the extraction circuit 200 to extract the threshold voltage and mobility from the drive transistor 220. FIG. 3A includes a signal 302 for the select input 230 in FIG. 2, a signal 304 ($\Phi_1$) to the switch 260, a signal 306 ($\Phi_2$) for the switch 262, a signal 308 ($\Phi_3$) for the switch 264, a signal 310 ($\Phi_4$) for the switch 254, a programming voltage signal 312 for the programming data input 232 in FIG. 2, a voltage 314 of the node 244 in FIG. 2 and an output voltage signal 316 for the output 256 of the amplifier 250 in FIG. 2.

FIG. 3A shows the four phases of the readout process, a reset phase 320, an integration phase 322, a pre-charge phase 324 and a read phase 326. The process starts by activating a high select signal 302 to the select input 230. The select signal 302 will be kept high throughout the readout process as shown in FIG. 3A.

During the reset phase 320, the input signal 304 ($\Phi_1$) to the switch 260 is set high in order to provide a discharge path to ground. The signals 306, 308 and 310 ($\Phi_2$, $\Phi_3$, $\Phi_4$) to the switches 262, 264 and 250 are kept low in this phase. A high enough voltage level ($V_{RST\_TFT}$) is applied to the programming data input 232 ($V_{Data}$) to maximize the current flow through the drive transistor 220. Consequently, the voltage at the node 244 in FIG. 2 is discharged to ground to get ready for the next cycle.

During the integration phase 322, the signal 304 ($\Phi_2$) to the switch 262 stays high which provides a charging path from the voltage source 210 through the switch 262. The signals 304, 308 and 310 ($\Phi_1$, $\Phi_3$, $\Phi_4$) to the switches 260, 264 and 250 are kept low in this phase. The programming voltage input 232 ($V_{Data}$) is set to a voltage level ($V_{INT\_TFT}$) such that once the capacitor 240 ($C_{oled}$) is fully charged, the voltage at the node 244 is less than the turn-on voltage of the OLED 222. This condition will minimize any interference from the OLED 222 during the reading of the drive transistor 220. Right before the end of integration time, the signal 312 to the programming voltage input 232 ($V_{Data}$) is lowered to $V_{OFF}$ in order to isolate the charge on the capacitor 240 ($C_{oled}$) from the rest of the circuit.

When the integration time is long enough, the charge stored on capacitor 240 ($C_{oled}$) will be a function of the threshold voltage of the drive transistor 220. For a shortened integration time, the voltage at the node 244 will experience an incomplete settling and the stored charge on the capacitor 240 ($C_{oled}$) will be a function of both the threshold voltage and mobility of the drive transistor 220. Accordingly, it is feasible to extract both parameters by taking two separate readings with short and long integration phases.

During the pre-charge phase 324, the signals 304 and 306 ($\Phi_1$, $\Phi_2$) to switches 260 and 262 are set low. Once the input signal 310 ($\Phi_4$) to the switch 254 is set high, the amplifier 250 is set in a unity feedback configuration. In order to protect the output stage of the amplifier 250 against short-circuit current from the supply voltage 210, the signal 308 ($\Phi_3$) to the switch 264 goes high when the signal 306 ($\Phi_2$) to the switch 262 is set low. When the switch 264 is closed, the parasitic capacitance 242 of the supply line is precharged to the common mode voltage, VCM. The common mode voltage, VCM, is a voltage level which must be lower than the ON voltage of the OLED 222. Right before the end of pre-charge phase, the signal 310 ($\Phi_4$) to the switch 254 is set low to prepare the charge pump amplifier 250 for the read cycle.

During the read phase 336, the signals 304, 306 and 310 ($\Phi_1$, $\Phi_2$, $\Phi_4$) to the switches 260, 262 and 254 are set low. The signal 308 ($\Phi_3$) to the switch 264 is kept high to provide a charge transfer path from the drive circuit 202 to the charge-pump amplifier 250. A high enough voltage 312 ($V_{RD\_TFT}$) is applied to the programming voltage input 232 ($V_{Data}$) to minimize the channel resistance of the drive transistor 220. If the integration cycle is long enough, the accumulated charge on the capacitor 252 ($C_{int}$) is not a function of integration time. Accordingly, the output voltage of the charge-pump amplifier 250 in this case is equal to:

$$V_{out} = -\frac{C_{oled}}{C_{int}}(V_{Data} - V_{th})$$

For a shortened integration time, the accumulated charge on the capacitor 252 ($C_{int}$) is given by:

$$Q_{int} = \int^{T_{int}} i_D(V_{GS}, V_{th}, \mu) \cdot dt$$

Consequently, the output voltage 256 of the charge-pump amplifier 250 at the end of read cycle equals:

$$V_{out} = -\frac{1}{C_{int}} \cdot \int^{T_{int}} i_D(V_{GS}, V_{th}, \mu) \cdot dt$$

Hence, the threshold voltage and the mobility of the drive transistor 220 may be extracted by reading the output voltage 256 of the amplifier 250 in the middle and at the end of the read phase 326.

FIG. 3B is a timing diagram for the reading process of the threshold turn-on voltage parameter of the OLED 222 in FIG. 2. The reading process of the OLED 222 also includes four phases, a reset phase 340, an integration phase 342, a pre-charge phase 344 and a read phase 346. Just like the reading process for the drive transistor 220 in FIG. 3A, the reading process for OLED starts by activating the select input 230 with a high select signal 302. The timing of the signals 304, 306, 308, and 310 ($\Phi_1$, $\Phi_2$, $\Phi_3$, $\Phi_4$) to the switches 260, 262, 264 and 254 is the same as the read process for the drive transistor 220 in FIG. 3A. A programming signal 332 for the programming input 232, a signal 334 for the node 244 and an output signal 336 for the output of the amplifier 250 are different from the signals in FIG. 3A.

During the reset phase 340, a high enough voltage level 332 ($V_{RST\_OLED}$) is applied to the programming data input 232 ($V_{Data}$) to maximize the current flow through the drive transistor 220. Consequently, the voltage at the node 244 in FIG. 2 is discharged to ground through the switch 260 to get ready for the next cycle.

During the integration phase 342, the signal 306 ($\Phi_2$) to the switch 262 stays high which provides a charging path from the voltage source 210 through the switch 262. The programming voltage input 232 ($V_{Data}$) is set to a voltage level 332 ($V_{INT\_OLED}$) such that once the capacitor 240 ($C_{oled}$) is fully charged, the voltage at the node 244 is greater than the turn-on voltage of the OLED 222. In this case, by the end of the integration phase 342, the drive transistor 220 is driving a constant current through the OLED 222.

During the pre-charge phase 344, the drive transistor 220 is turned off by the signal 332 to the programming input 232. The capacitor 240 ($C_{oled}$) is allowed to discharge until it reaches the turn-on voltage of OLED 222 by the end of the pre-charge phase 344.

During the read phase 346, a high enough voltage 332 ($V_{RD\_OLED}$) is applied to the programming voltage input 232 ($V_{Data}$) to minimize the channel resistance of the drive transistor 220. If the pre-charge phase is long enough, the settled voltage across the capacitor 252 ($C_{int}$) will not be a function of pre-charge time. Consequently, the output voltage 256 of the charge-pump amplifier 250 at the end of the read phase is given by:

$$V_{out} = -\frac{C_{oled}}{C_{int}} \cdot V_{ON,oled}$$

The signal 308 ($\Phi_3$) to the switch 264 is kept high to provide a charge transfer path from the drive circuit 202 to the charge-pump amplifier 250. Thus the output voltage signal 336 may be used to determine the turn-on voltage of the OLED 220.

FIG. 3C is a timing diagram for the direct reading of the drive transistor 220 using the extraction circuit 200 in FIG. 2. The direct reading process has a reset phase 350, a pre-charge phase 352 and an integrate/read phase 354. The readout process is initiated by activating the select input 230 in FIG. 2. The select signal 302 to the select input 230 is kept high throughout the readout process as shown in FIG. 3C. The signals 364 and 366 ($\Phi_1$, $\Phi_2$) for the switches 260 and 262 are inactive in this readout process.

During the reset phase 350, the signals 368 and 370 ($\Phi_3$, $\Phi_4$) for the switches 264 and 254 are set high in order to provide a discharge path to virtual ground. A high enough voltage 372 ($V_{RST\_TFT}$) is applied to the programming input 232 ($V_{Data}$) to maximize the current flow through the drive transistor 220. Consequently, the node 244 is discharged to the common-mode voltage 374 ($VCM_{RST}$) to get ready for the next cycle.

During the pre-charge phase 354, the drive transistor 220 is turned off by applying an off voltage 372 ($V_{OFF}$) to the programming input 232 in FIG. 2. The common-mode voltage input 258 to the positive input of the amplifier 250 is raised to $VCM_{RD}$ in order to precharge the line capacitance. At the end of the pre-charge phase 354, the signal 370 ($\Phi_4$) to the switch 254 is turned off to prepare the charge-pump amplifier 250 for the next cycle.

At the beginning of the read/integrate phase 356, the programming voltage input 232 ($V_{Data}$) is raised to $V_{INT\_TFT}$ 372 to turn the drive transistor 220 on. The capacitor 240 ($C_{OLED}$) starts to accumulate the charge until $V_{Data}$ minus the voltage at the node 244 is equal to the threshold voltage of the drive transistor 220. In the meantime, a proportional charge is accumulated in the capacitor 252 ($C_{INT}$). Accordingly, at the end of the read cycle 356, the output voltage 376 at the output 256 of the amplifier 250 is a function of the threshold voltage which is given by:

$$V_{out} = \frac{C_{oled}}{C_{int}} \cdot (V_{Data} - V_{th})$$

As indicated by the above equation, in the case of the direct reading, the output voltage has a positive polarity. Thus, the threshold voltage of the drive transistor 220 may be determined by the output voltage of the amplifier 250.

Figure 4A:
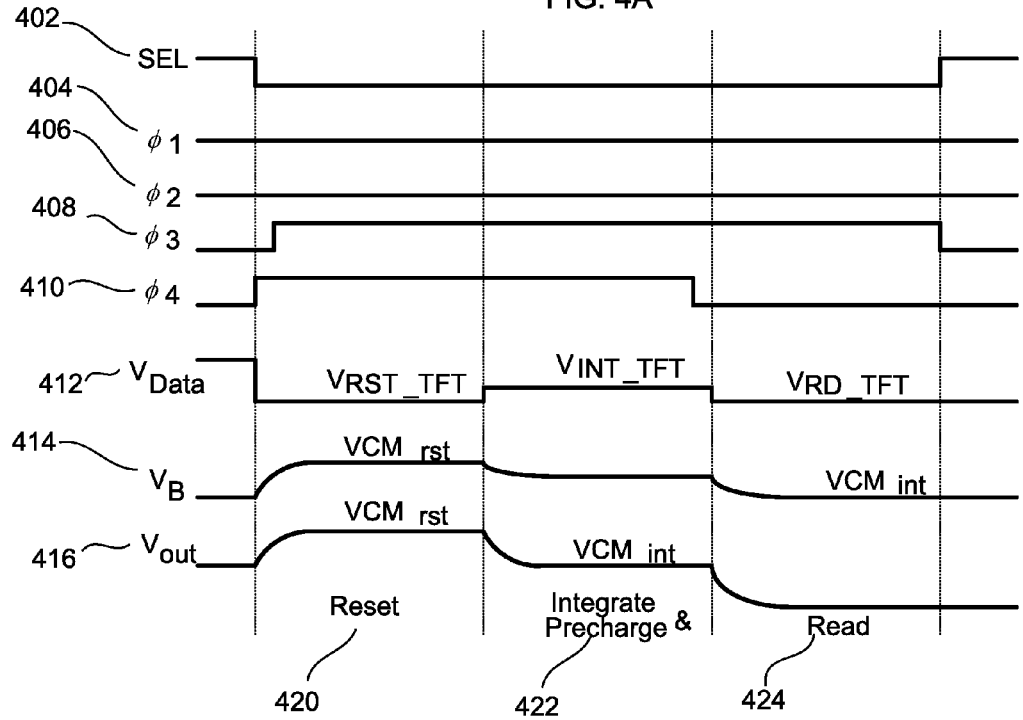
FIG. 4A is a signal timing diagram of the signals to the data extraction circuit to extract the threshold voltage and mobility of a p-type drive transistor in FIG. 2.

As explained above, the drive transistor 220 in FIG. 2 may be a p-type transistor. FIG. 4A-4C are signal timing diagrams of the signals applied to the components in FIG. 2 to extract voltage threshold and mobility from the drive transistor 220 and the OLED 222 when the drive transistor 220 is a p-type transistor. In the example where the drive transistor 220 is a p-type transistor, the source of the drive transistor 220 is coupled to the supply line 212 (VD) and the drain of the drive transistor 220 is coupled to the OLED 222. FIG. 4A is a timing diagram showing the signals applied to the extraction circuit 200 to extract the threshold voltage and mobility from the drive transistor 220 when the drive transistor 220 is a p-type transistor. FIG. 4A shows voltage signals 402-416 for the select input 232, the switches 260, 262, 264 and 254, the programming data input 230, the voltage at the node 244 and the output voltage 256 in FIG. 2. The data extraction is performed in three phases, a reset phase 420, an integrate/pre-charge phase 422, and a read phase 424.

As shown in FIG. 4A, the select signal 402 is active low and kept low throughout the readout phases 420, 422 and 424. Throughout the readout process, the signals 404 and 406 ($\Phi_1$, $\Phi_2$) to the switches 260 and 262 are kept low (inactive). During the reset phase, the signals 408 and 410 ($\Phi_3$, $\Phi_4$) at the switches 264 and 254 are set to high in order to charge the node 244 to a reset common mode voltage level $VCM_{rst}$. The common-mode voltage input 258 on the charge-pump input 258 ($VCM_{rst}$) should be low enough to keep the OLED 222 off. The programming data input 232 $V_{Data}$ is set to a low enough value 412 ($V_{RST\_TFT}$) to provide maximum charging current through the driver transistor 220.

During the integrate/pre-charge phase 422, the common-mode voltage on the common voltage input 258 is reduced to $VCM_{int}$ and the programming input 232 ($V_{Data}$) is increased to a level 412 ($V_{INT\_TFT}$) such that the drive transistor 220 will conduct in the reverse direction. If the allocated time for this phase is long enough, the voltage at the node 244 will decline until the gate to source voltage of the drive transistor 220 reaches the threshold voltage of the drive transistor 220. Before the end of this cycle, the signal 410 ($\Phi_4$) to the switch 254 goes low in order to prepare the charge-pump amplifier 250 for the read phase 424.

The read phase 424 is initiated by decreasing the signal 412 at the programming input 232 ($V_{Data}$) to $V_{RD\_TFT}$ so as to turn the drive transistor 220 on. The charge stored on the capacitor 240 ($C_{OLED}$) is now transferred to the capacitor 254 ($C_{INT}$). At the end of the read phase 424, the signal 408 ($\Phi_3$) to the switch 264 is set to low in order to isolate the charge-pump amplifier 250 from the drive circuit 202. The output voltage signal 416

$V_{out}$ from the amplifier output 256 is now a function of the threshold voltage of the drive transistor 220 given by:

$$V_{out} = -\frac{C_{oled}}{C_{int}}(V_{INT\_TFT} - V_{th})$$

FIG. 4B is a timing diagram for the in-pixel extraction of the threshold voltage of the OLED 222 in FIG. 2 assuming that the drive transistor 220 is a p-type transistor. The extraction process is very similar to the timing of signals to the extraction circuit 200 for an n-type drive transistor in FIG. 3A. FIG. 4B shows voltage signals 432-446 for the select input 230, the switches 260, 262, 264 and 254, the programming data input 232, the voltage at the node 244 and the amplifier output 256 in FIG. 2. The extraction process includes a reset phase 450, an integration phase 452, a pre-charge phase 454 and a read phase 456. The major difference in this readout cycle in comparison to the readout cycle in FIG. 4A is the voltage levels of the signal 442 to the programming data input 232 ($V_{Data}$) that are applied to the driver circuit 210 in each readout phase. For a p-type thin film transistor that may be used for the drive transistor 220, the select signal 430 to the select input 232 is active low. The select input 232 is kept low throughout the readout process as shown in FIG. 4B.

The readout process starts by first resetting the capacitor 240 ($C_{OLED}$) in the reset phase 450. The signal 434 ($\Phi_1$) to the switch 260 is set high to provide a discharge path to ground. The signal 442 to the programming input 232 ($V_{Data}$) is lowered to $V_{RST\_OLED}$ in order to turn the drive transistor 220 on.

In the integrate phase 452, the signals 434 and 436 ($\Phi_1, \Phi_2$) to the switches 260 and 262 are set to off and on states respectively, to provide a charging path to the OLED 222. The capacitor 240 ($C_{OLED}$) is allowed to charge until the voltage 444 at node 244 goes beyond the threshold voltage of the OLED 222 to turn it on. Before the end of the integration phase 452, the voltage signal 442 to the programming input 232 ($V_{Data}$) is raised to $V_{OFF}$ to turn the drive transistor 220 off.

During the pre-charge phase 454, the accumulated charge on the capacitor 240 ($C_{OLED}$) is discharged into the OLED 222 until the voltage 444 at the node 244 reaches the threshold voltage of the OLED 222. Also, in the pre-charge phase 454, the signals 434 and 436 ($\Phi_1, \Phi_2$) to the switches 260 and 262 are turned off while the signals 438 and 440 ($\Phi_3, \Phi_4$) to the switches 264 and 254 are set on. This provides the condition for the amplifier 250 to precharge the supply line 212 (VD) to the common mode voltage input 258 (VCM) provided at the positive input of the amplifier 250. At the end of the pre-charge phase, the signal 430 ($\Phi_4$) to the switch 254 is turned off to prepare the charge-pump amplifier 250 for the read phase 456.

The read phase 456 is initiated by turning the drive transistor 220 on when the voltage 442 to the programming input 232 ($V_{Data}$) is lowered to $V_{RD\_OLED}$. The charge stored on the capacitor 240 ($C_{OLED}$) is now transferred to the capacitor 254 ($C_{INT}$) which builds up the output voltage 446 at the output 256 of the amplifier 250 as a function of the threshold voltage of the OLED 220.

FIG. 4C is a signal timing diagram for the direct extraction of the threshold voltage of the drive transistor 220 in the extraction system 200 in FIG. 2 when the drive transistor 220 is a p-type transistor. FIG. 4C shows voltage signals 462-476 for the select input 230, the switches 260, 262, 264 and 254, the programming data input 232, the voltage at the node 244 and the output voltage 256 in FIG. 2. The extraction process includes a pre-charge phase 480 and an integration phase 482. However, in the timing diagram in FIG. 4C, a dedicated final read phase 484 is illustrated which may be eliminated if the output of charge-pump amplifier 250 is sampled at the end of the integrate phase 482.

The extraction process is initiated by simultaneous pre-charging of the drain storage capacitor 224, the source storage capacitor 226, the capacitor 240 ($C_{OLED}$) and the capacitor 242 in FIG. 2. For this purpose, the signals 462, 468 and 470 to the select line input 230 and the switches 264 and 254 are activated as shown in FIG. 4C. Throughout the readout process, the signals 404 and 406 ($\Phi_1, \Phi_2$) to the switches 260 and 262 are kept low. The voltage level of common mode voltage input 258 (VCM) determines the voltage on the supply line 212 and hence the voltage at the node 244. The common mode voltage (VCM) should be low enough such that the OLED 222 does not turn on. The voltage 472 to the programming input 232 ($V_{Data}$) is set to a level ($V_{RST\_TFT}$) low enough to turn the transistor 220 on.

At the beginning of the integrate phase 482, the signal 470 ($\Phi_4$) to the switch 254 is turned off in order to allow the charge-pump amplifier 250 to integrate the current through the drive transistor 220. The output voltage 256 of the charge-pump amplifier 250 will incline at a constant rate which is a function of the threshold voltage of the drive transistor 220 and its gate-to-source voltage. Before the end of the integrate phase 482, the signal 468 ($\Phi_3$) to the switch 264 is turned off to isolate the charge-pump amplifier 250 from the driver circuit 220. Accordingly, the output voltage 256 of the amplifier 250 is given by:

$$V_{out} = I_{TFT} \cdot \frac{T_{int}}{C_{int}}$$

where $I_{TFT}$ is the drain current of the drive transistor 220 which is a function of the mobility and ($V_{CM}$-$V_{Data}$-|$V_{th}$|). $T_{int}$ is the length of the integration time. In the optional read phase 484, the signal 468 ($\Phi_3$) to the switch 264 is kept low to isolate the charge-pump amplifier 250 from the driver circuit 202. The output voltage 256, which is a function of the mobility and threshold voltage of the drive transistor 220, may be sampled any time during the read phase 484.

FIG. 4D is a timing diagram for the direct reading of the OLED 222 in FIG. 2. When the drive transistor 220 is turned on with a high enough gate-to-source voltage it may be utilized as an analog switch to access the anode terminal of the OLED 222. In this case, the voltage at the node 244 is essentially equal to the voltage on the supply line 212 (VD). Accordingly, the drive current through the drive transistor 220 will only be a function of the turn-on voltage of the OLED 222 and the voltage that is set on the supply line 212. The drive current may be provided by the charge-pump amplifier 250. When integrated over a certain time period, the output voltage 256 of the integrator circuit 206 is a measure of how much the OLED 222 has aged.

FIG. 4D is a timing diagram showing the signals applied to the extraction circuit 200 to extract the turn-on voltage from the OLED 222 via a direct read. FIG. 4D shows the three phases of the readout process, a pre-charge phase 486, an integrate phase 487 and a read phase 488. FIG. 4D includes a signal 489n or 489p for the select input 230 in FIG. 2, a signal 490 ($\Phi_1$) to the switch 260, a signal 491 ($\Phi_2$) for the switch 262, a signal 492 ($\Phi_3$) for the switch 264, a signal 493 ($\Phi_4$) for the switch 254, a programming voltage signal 494*n* or 494*p* for the programming data input 232 in FIG. 2, a voltage 495 of the node 244 in FIG. 2 and an output voltage signal 496 for the output 256 of the amplifier 250 in FIG. 2.

The process starts by activating the select signal corresponding to the desired row of pixels in array 102. As illustrated in FIG. 4D, the select signal 489*n* is active high for an n-type select transistor and active low for a p-type select transistor. A high select signal 489*n* is applied to the select input 230 in the case of an n-type drive transistor. A low signal 489*p* is applied to the select input 230 in the case of a p-type drive transistor for the drive transistor 220.

The select signal 489*n* or 489*p* will be kept active during the pre-charge and integrate cycles 486 and 487. The $\Phi_1$ and $\Phi_2$ inputs 490 and 491 are inactive in this readout method. During the pre-charge cycle, the switch signals 492 $\Phi_3$ and 493 $\Phi_4$ are set high in order to provide a signal path such that the parasitic capacitance 242 of the supply line ($C_p$) and the voltage at the node 244 are pre-charged to the common-mode voltage ($VCM_{OLED}$) provided to the non-inverting terminal of the amplifier 250. A high enough drive voltage signal 494*n* or 494*p* ($V_{ON\_nTFT}$ or $V_{ON\_pTFT}$) is applied to the data input 232 ($V_{Data}$) to operate the drive transistor 220 as an analog switch. Consequently, the supply voltage 212 VD and the node 244 are pre-charged to the common-mode voltage ($VCM_{OLED}$) to get ready for the next cycle. At the beginning of the integrate phase 487, the switch input 493 $\Phi_4$ is turned off in order to allow the charge-pump module 206 to integrate the current of the OLED 222. The output voltage 496 of the charge-pump module 206 will incline at a constant rate which is a function of the turn-on voltage of the OLED 222 and the voltage 495 set on the node 244, i.e. $VCM_{OLED}$. Before the end of the integrate phase 487, the switch signal 492 $\Phi_3$ is turned off to isolate the charge-pump module 206 from the pixel circuit 202. From this instant beyond, the output voltage is constant until the charge-pump module 206 is reset for another reading. When integrated over a certain time period, the output voltage of the integrator is given by:

$$V_{out} = I_{OLED} \frac{T_{int}}{C_{int}}$$

which is a measure of how much the OLED has aged. $T_{int}$ in this equation is the time interval between the falling edge of the switch signal 493 ($\Phi_4$) to the falling edge of the switch signal 492 ($\Phi_3$).

Figure 5:
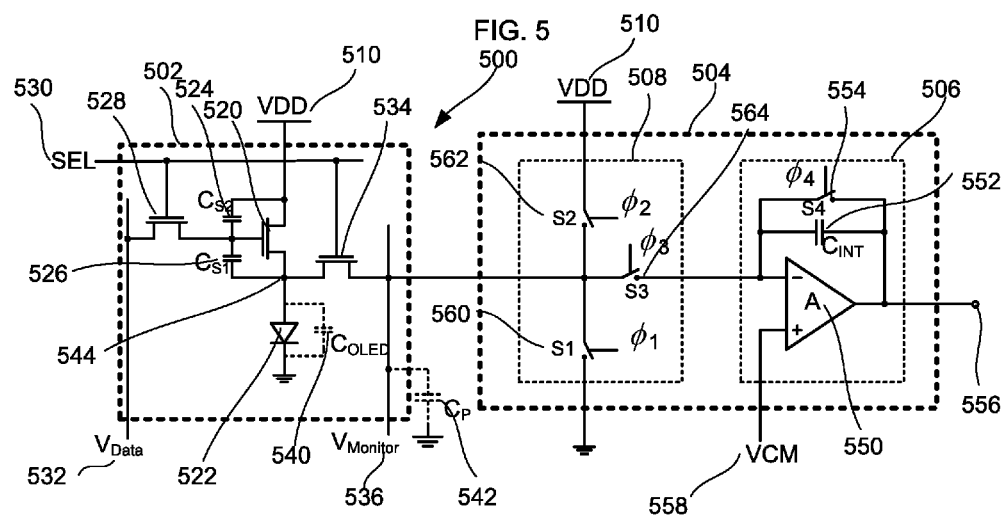
FIG. 5 is a circuit diagram of a data extraction circuit for a three-transistor drive circuit for a pixel in the AMOLED display in FIG. 1 for extraction of parameters.

Similar extraction processes of a two transistor type driver circuit such as that in FIG. 2 may be utilized to extract non-uniformity and aging parameters such as threshold voltages and mobility of a three transistor type driver circuit as part of the data extraction system 500 as shown in FIG. 5. The data extraction system 500 includes a drive circuit 502 and a readout circuit 504. The readout circuit 504 is part of the current supply and readout circuit 120 and gathers data from a column of pixels 104 as shown in FIG. 1 and includes a charge pump circuit 506 and a switch-box circuit 508. A voltage source 510 provides the supply voltage (VDD) to the drive circuit 502. The charge-pump and switch-box circuits 506 and 508 are implemented on the top or bottom side of the array 102 such as in the voltage drive 114 and the current supply and readout circuit 120 in FIG. 1. This is achieved by either direct fabrication on the same substrate as for the array 102 or by bonding a microchip on the substrate or a flex as a hybrid solution.

The drive circuit 502 includes a drive transistor 520, an organic light emitting device 522, a drain storage capacitor 524, a source storage capacitor 526 and a select transistor 528. A select line input 530 is coupled to the gate of the select transistor 528. A programming input 532 is coupled through the select transistor 528 to the gate of the drive transistor 220. The select line input 530 is also coupled to the gate of an output transistor 534. The output transistor 534 is coupled to the source of the drive transistor 520 and a voltage monitoring output line 536. The drain of the drive transistor 520 is coupled to the supply voltage source 510 and the source of the drive transistor 520 is coupled to the OLED 522. The source storage capacitor 526 is coupled between the gate and the source of the drive transistor 520. The drain storage capacitor 524 is coupled between the gate and the drain of the drive transistor 520. The OLED 522 has a parasitic capacitance that is modeled as a capacitor 540. The monitor output voltage line 536 also has a parasitic capacitance that is modeled as a capacitor 542. The drive transistor 520 in this example is a thin film transistor that is fabricated from amorphous silicon. A voltage node 544 is the point between the source terminal of the drive transistor 520 and the OLED 522. In this example, the drive transistor 520 is an n-type transistor. The system 500 may be implemented with a p-type drive transistor in place of the drive transistor 520.

The readout circuit 504 includes the charge-pump circuit 506 and the switch-box circuit 508. The charge-pump circuit 506 includes an amplifier 550 which has a capacitor 552 ($C_{int}$) in a negative feedback loop. A switch 554 (S4) is utilized to discharge the capacitor 552 $C_{int}$ during the pre-charge phase. The amplifier 550 has a negative input coupled to the capacitor 552 and the switch 554 and a positive input coupled to a common mode voltage input 558 (VCM). The amplifier 550 has an output 556 that is indicative of various extracted factors of the drive transistor 520 and OLED 522 as will be explained below.

The switch-box circuit 508 includes several switches 560, 562 and 564 to direct the current to and from the drive circuit 502. The switch 560 is used during the reset phase to provide the discharge path to ground. The switch 562 provides the supply connection during normal operation of the pixel 104 and also during the integration phase of the readout process. The switch 564 is used to isolate the charge-pump circuit 506 from the supply line voltage source 510.

In the three transistor drive circuit 502, the readout is normally performed through the monitor line 536. The readout can also be taken through the voltage supply line from the supply voltage source 510 similar to the process of timing signals in FIG. 3A-3C. Accurate timing of the input signals ($\Phi_1$-$\Phi_4$) to the switches 560, 562, 564 and 554, the select input 530 and the programming voltage input 532 ($V_{Data}$) is used to control the performance of the readout circuit 500. Certain voltage levels are applied to the programming data input 532 ($V_{Data}$) and the common mode voltage input 558 (VCM) during each phase of readout process.

The three transistor drive circuit 502 may be programmed differentially through the programming voltage input 532 and the monitoring output 536. Accordingly, the reset and pre-charge phases may be merged together to form a reset/pre-charge phase and which is followed by an integrate phase and a read phase.

Figure 6A:
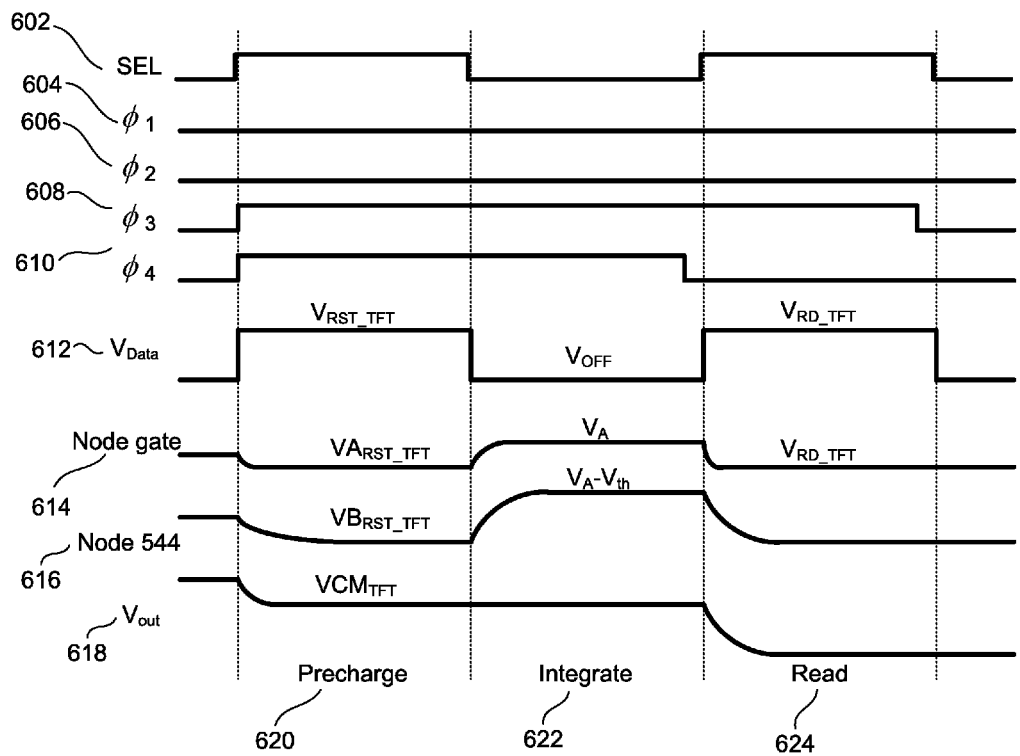
FIG. 6A is a signal timing diagram of the signals to the data extraction circuit to extract the threshold voltage and mobility of the drive transistor in FIG. 5.

FIG. 6A is a timing diagram of the signals involving the extraction of the threshold voltage and mobility of the drive transistor 520 in FIG. 5. The timing diagram includes voltage signals 602-618 for the select input 530, the switches 560, 562, 564 and 554, the programming voltage input 532, the voltage at the gate of the drive transistor 520, the voltage at the node 544 and the output voltage 556 in FIG. 5. The readout process in FIG. 6A has a pre-charge phase 620, an integrate phase 622 and a read phase 624. The readout process initiates by simultaneous precharging of the drain capacitor 524, the source capacitor 526, and the parasitic capacitors 540 and 542. For this purpose, the select line voltage 602 and the signals 608 and 610 ($\Phi_3$, $\Phi_4$) to the switches 564 and 554 are activated as shown in FIG. 6A. The signals 604 and 606 ($\Phi_1$, $\Phi_2$) to the switches 560 and 562 remain low throughout the readout cycle.

The voltage level of the common mode input 558 (VCM) determines the voltage on the output monitor line 536 and hence the voltage at the node 544. The voltage to the common mode input 558 ($VCM_{TFT}$) should be low enough such that the OLED 522 does not turn on. In the pre-charge phase 620, the voltage signal 612 to the programming voltage input 532 ($V_{Data}$) is high enough ($V_{RST\_TFT}$) to turn the drive transistor 520 on, and also low enough such that the OLED 522 always stays off.

At the beginning of the integrate phase 622, the voltage 602 to the select input 530 is deactivated to allow a charge to be stored on the capacitor 540 ($C_{OLED}$). The voltage at the node 544 will start to rise and the gate voltage of the drive transistor 520 will follow that with a ratio of the capacitance value of the source capacitor 526 over the capacitance of the source capacitor 526 and the drain capacitor 524 [$C_{S1}/(C_{S1}+C_{S2})$]. The charging will complete once the difference between the gate voltage of the drive transistor 520 and the voltage at node 544 is equal to the threshold voltage of the drive transistor 520. Before the end of the integration phase 622, the signal 610 ($\Phi_4$) to the switch 554 is turned off to prepare the charge-pump amplifier 550 for the read phase 624.

For the read phase 624, the signal 602 to the select input 530 is activated once more. The voltage signal 612 to the programming input 532 ($V_{RD\_TFT}$) is low enough to keep the drive transistor 520 off. The charge stored on the capacitor 240 ($C_{OLED}$) is now transferred to the capacitor 254 ($C_{INT}$) and creates an output voltage 618 proportional to the threshold voltage of the drive transistor 520:

$$V_{out} = -\frac{C_{oled}}{C_{int}}(V_G - V_{th})$$

Before the end of the read phase 624, the signal 608 ($\Phi_3$) to the switch 564 turns off to isolate the charge-pump circuit 506 from the drive circuit 502.

FIG. 6B is a timing diagram for the input signals for extraction of the turn-on voltage of the OLED 522 in FIG. 5. FIG. 6B includes voltage signals 632-650 for the select input 530, the switches 560, 562, 564 and 554, the programming voltage input 532, the voltage at the gate of the drive transistor 520, the voltage at the node 544, the common mode voltage input 558, and the output voltage 556 in FIG. 5. The readout process in FIG. 6B has a pre-charge phase 652, an integrate phase 654 and a read phase 656. Similar to the readout for the drive transistor 220 in FIG. 6A, the readout process starts with simultaneous precharging of the drain capacitor 524, the source capacitor 526, and the parasitic capacitors 540 and 542 in the pre-charge phase 652. For this purpose, the signal 632 to the select input 530 and the signals 638 and 640 ($\Phi_3$, $\Phi_4$) to the switches 564 and 554 are activated as shown in FIG. 6B. The signals 634 and 636 ($\Phi_1$, $\Phi_2$) remain low throughout the readout cycle. The input voltage 648 ($VCM_{Pre}$) to the common mode voltage input 258 should be high enough such that the OLED 522 is turned on. The voltage 642 ($V_{Pre\_OLED}$) to the programming input 532 ($V_{Data}$) is low enough to keep the drive transistor 520 off.

At the beginning of the integrate phase 654, the signal 632 to the select input 530 is deactivated to allow a charge to be stored on the capacitor 540 ($C_{OLED}$). The voltage at the node 544 will start to fall and the gate voltage of the drive transistor 520 will follow with a ratio of the capacitance value of the source capacitor 526 over the capacitance of the source capacitor 526 and the drain capacitor 524 [$C_{S1}/(C_{S1}+C_{S2})$]. The discharging will complete once the voltage at node 544 reaches the ON voltage ($V_{OLED}$) of the OLED 522. Before the end of the integration phase 654, the signal 640 ($\Phi_4$) to the switch 554 is turned off to prepare the charge-pump circuit 506 for the read phase 656.

For the read phase 656, the signal 632 to the select input 530 is activated once more. The voltage 642 on the ($V_{RD\_OLED}$) programming input 532 should be low enough to keep the drive transistor 520 off. The charge stored on the capacitor 540 ($C_{OLED}$) is then transferred to the capacitor 552 ($C_{INT}$) creating an output voltage 650 at the amplifier output 556 proportional to the ON voltage of the OLED 522.

$$V_{out} = -\frac{C_{oled}}{C_{int}} \cdot V_{ON,oled}$$

The signal 638 ($\Phi_3$) turns off before the end of the read phase 656 to isolate the charge-pump circuit 508 from the drive circuit 502.

As shown, the monitor output transistor 534 provides a direct path for linear integration of the current for the drive transistor 520 or the OLED 522. The readout may be carried out in a pre-charge and integrate cycle. However, FIG. 6C shows timing diagrams for the input signals for an additional final read phase which may be eliminated if the output of charge-pump circuit 508 is sampled at the of the integrate phase. FIG. 6C includes voltage signals 660-674 for the select input 530, the switches 560, 562, 564 and 554, the programming voltage input 532, the voltage at the node 544, and the output voltage 556 in FIG. 5. The readout process in FIG. 6C therefore has a pre-charge phase 676, an integrate phase 678 and an optional read phase 680.

The direct integration readout process of the n-type drive transistor 520 in FIG. 5 as shown in FIG. 6C is initiated by simultaneous precharging of the drain capacitor 524, the source capacitor 526, and the parasitic capacitors 540 and 542. For this purpose, the signal 660 to the select input 530 and the signals 666 and 668 ($\Phi_3$, $\Phi_4$) to the switches 564 and 554 are activated as shown in FIG. 6C. The signals 662 and 664 ($\Phi_1$, $\Phi_2$) to the switches 560 and 562 remain low throughout the readout cycle. The voltage level of the common mode voltage input 558 (VCM) determines the voltage on the monitor output line 536 and hence the voltage at the node 544. The voltage signal ($VCM_{TFT}$) of the common mode voltage input 558 is low enough such that the OLED 522 does not turn on. The signal 670 ($V_{ON\_TFT}$) to the programming input 532 ($V_{Data}$) is high enough to turn the drive transistor 520 on.

At the beginning of the integrate phase 678, the signal 668 ($\Phi_4$) to the switch 554 is turned off in order to allow the charge-pump amplifier 550 to integrate the current from the drive transistor 520. The output voltage 674 of the charge-pump amplifier 550 declines at a constant rate which is a function of the threshold voltage, mobility and the gate-to-source voltage of the drive transistor 520. Before the end of the integrate phase, the signal 666 ($\Phi_3$) to the switch 564 is turned off to isolate the charge-pump circuit 508 from the drive circuit 502. Accordingly, the output voltage is given by:

$$V_{out} = -I_{TFT} \cdot \frac{T_{int}}{C_{int}}$$

where $I_{TFT}$ is the drain current of drive transistor 520 which is a function of the mobility and $(V_{Data}-V_{CM}V_{th})$. $T_{int}$ is the length of the integration time. The output voltage 674, which is a function of the mobility and threshold voltage of the drive transistor 520, may be sampled any time during the read phase 680.

Figure 6D:
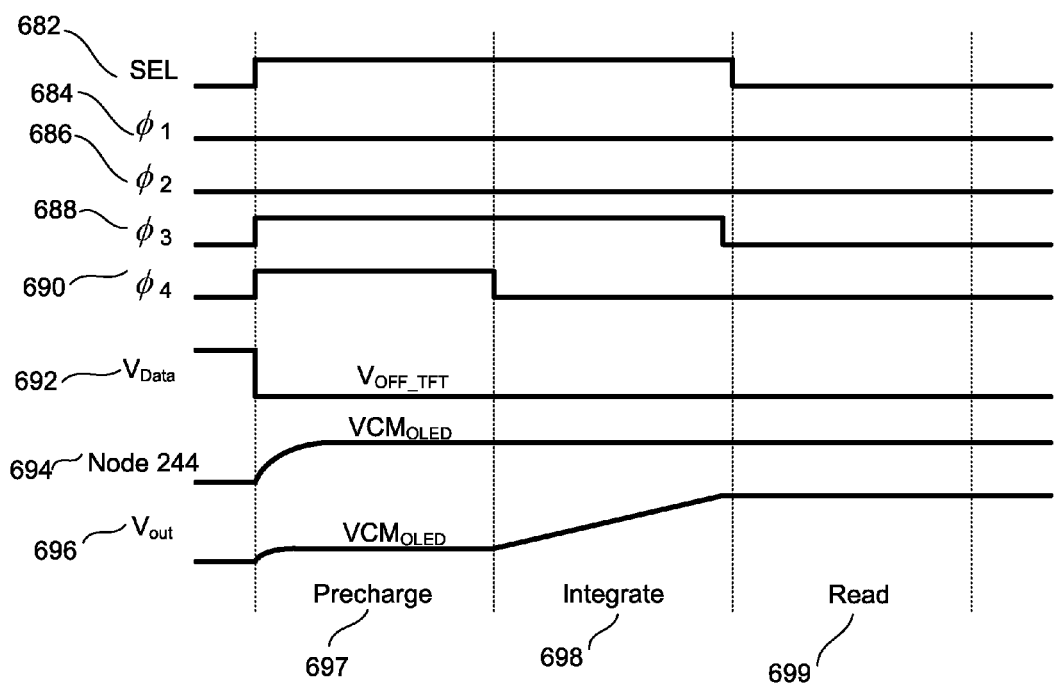
FIG. 6D is a signal timing diagram of the signals to the data extraction circuit for a direct read to extract the characteristic voltage of the OLED in FIG. 5.

FIG. 6D shows a timing diagram of input signals for the direct reading of the on (threshold) voltage of the OLED 522 in FIG. 5. FIG. 6D includes voltage signals 682-696 for the select input 530, the switches 560, 562, 564 and 554, the programming voltage input 532, the voltage at the node 544, and the output voltage 556 in FIG. 5. The readout process in FIG. 6C has a pre-charge phase 697, an integrate phase 698 and an optional read phase 699.

The readout process in FIG. 6D is initiated by simultaneous precharging of the drain capacitor 524, the source capacitor 526, and the parasitic capacitors 540 and 542. For this purpose, the signal 682 to the select input 530 and the signals 688 and 690 ($\Phi_3$, $\Phi_4$) to the switches 564 and 554 are activated as shown in FIG. 6D. The signals 684 and 686 ($\Phi_1$, $\Phi_2$) remain low throughout the readout cycle. The voltage level of the common mode voltage input 558 (VCM) determines the voltage on the monitor output line 536 and hence the voltage at the node 544. The voltage signal ($VCM_{OLED}$) of the common mode voltage input 558 is high enough such to turn the OLED 522 on. The signal 692 ($V_{OFF\_TFT}$) of the programming input 532 ($V_{Data}$) is low enough to keep the drive transistor 520 off.

At the beginning of the integrate phase 698, the signal 690 ($\Phi_4$) to the switch 552 is turned off in order to allow the charge-pump amplifier 550 to integrate the current from the OLED 522. The output voltage 696 of the charge-pump amplifier 550 will incline at a constant rate which is a function of the threshold voltage and the voltage across the OLED 522.

Before the end of the integrate phase 698, the signal 668 ($\Phi_3$) to the switch 564 is turned off to isolate the charge-pump circuit 508 from the drive circuit 502. Accordingly, the output voltage is given by:

$$V_{out} = I_{OLED} \cdot \frac{T_{int}}{C_{int}}$$

where $I_{OLED}$ is the OLED current which is a function of $(V_{CM}-V_{th})$, and $T_{int}$ is the length of the integration time. The output voltage, which is a function of the threshold voltage of the OLED 522, may be sampled any time during the read phase 699.

The controller 112 in FIG. 1 may be conveniently implemented using one or more general purpose computer systems, microprocessors, digital signal processors, micro-controllers, application specific integrated circuits (ASIC), programmable logic devices (PLD), field programmable logic devices (FPLD), field programmable gate arrays (FPGA) and the like, programmed according to the teachings as described and illustrated herein, as will be appreciated by those skilled in the computer, software and networking arts.

In addition, two or more computing systems or devices may be substituted for any one of the controllers described herein. Accordingly, principles and advantages of distributed processing, such as redundancy, replication, and the like, also can be implemented, as desired, to increase the robustness and performance of controllers described herein. The controllers may also be implemented on a computer system or systems that extend across any network environment using any suitable interface mechanisms and communications technologies including, for example telecommunications in any suitable form (e.g., voice, modem, and the like), Public Switched Telephone Network (PSTNs), Packet Data Networks (PDNs), the Internet, intranets, a combination thereof, and the like.

Figure 7:
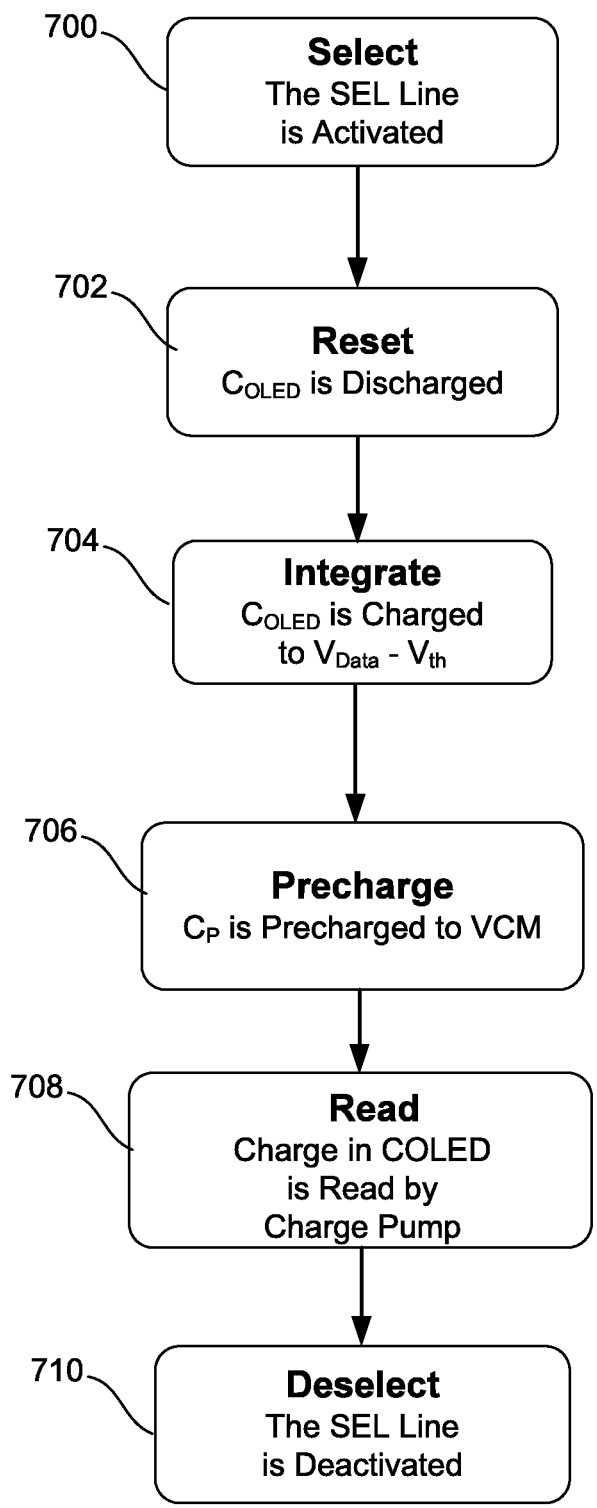
FIG. 7 is a flow diagram of the extraction cycle to readout the characteristics of the drive transistor and the OLED of a pixel circuit in an AMOLED display.

The operation of the example data extraction process, will now be described with reference to the flow diagram shown in FIG. 7. The flow diagram in FIG. 7 is representative of example machine readable instructions for determining the threshold voltages and mobility of a simple driver circuit that allows maximum aperture for a pixel 104 in FIG. 1. In this example, the machine readable instructions comprise an algorithm for execution by: (a) a processor, (b) a controller, and/or (c) one or more other suitable processing device(s). The algorithm may be embodied in software stored on tangible media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or embodied in firmware or dedicated hardware in a well known manner (e.g., it may be implemented by an application specific integrated circuit (ASIC), a programmable logic device (PLD), a field programmable logic device (FPLD), a field programmable gate array (FPGA), discrete logic, etc.). For example, any or all of the components of the extraction sequence could be implemented by software, hardware, and/or firmware. Also, some or all of the machine readable instructions represented by the flowchart of FIG. 7 may be implemented manually. Further, although the example algorithm is described with reference to the flowchart illustrated in FIG. 7, persons of ordinary skill in the art will readily appreciate that many other methods of implementing the example machine readable instructions may alternatively be used. For example, the order of execution of the blocks may be changed, and/or some of the blocks described may be changed, eliminated, or combined.

A pixel 104 under study is selected by turning the corresponding select and programming lines on (700). Once the pixel 104 is selected, the readout is performed in four phases. The readout process begins by first discharging the parasitic capacitance across the OLED ($C_{oled}$) in the reset phase (702). Next, the drive transistor is turned on for a certain amount of time which allows some charge to be accumulated on the capacitance across the OLED $C_{oled}$ (704). In the integrate phase, the select transistor is turned off to isolate the charge on the capacitance across the OLED $C_{oled}$ and then the line parasitic capacitance ($C_P$) is precharged to a known voltage level (706). Finally, the drive transistor is turned on again to allow the charge on the capacitance across the OLED $C_{oled}$ to be transferred to the charge-pump amplifier output in a read phase (708). The amplifier's output represent a quantity which is a function of mobility and threshold voltage. The readout process is completed by deselecting the pixel to prevent interference while other pixels are being calibrated (710).

Figure 8:
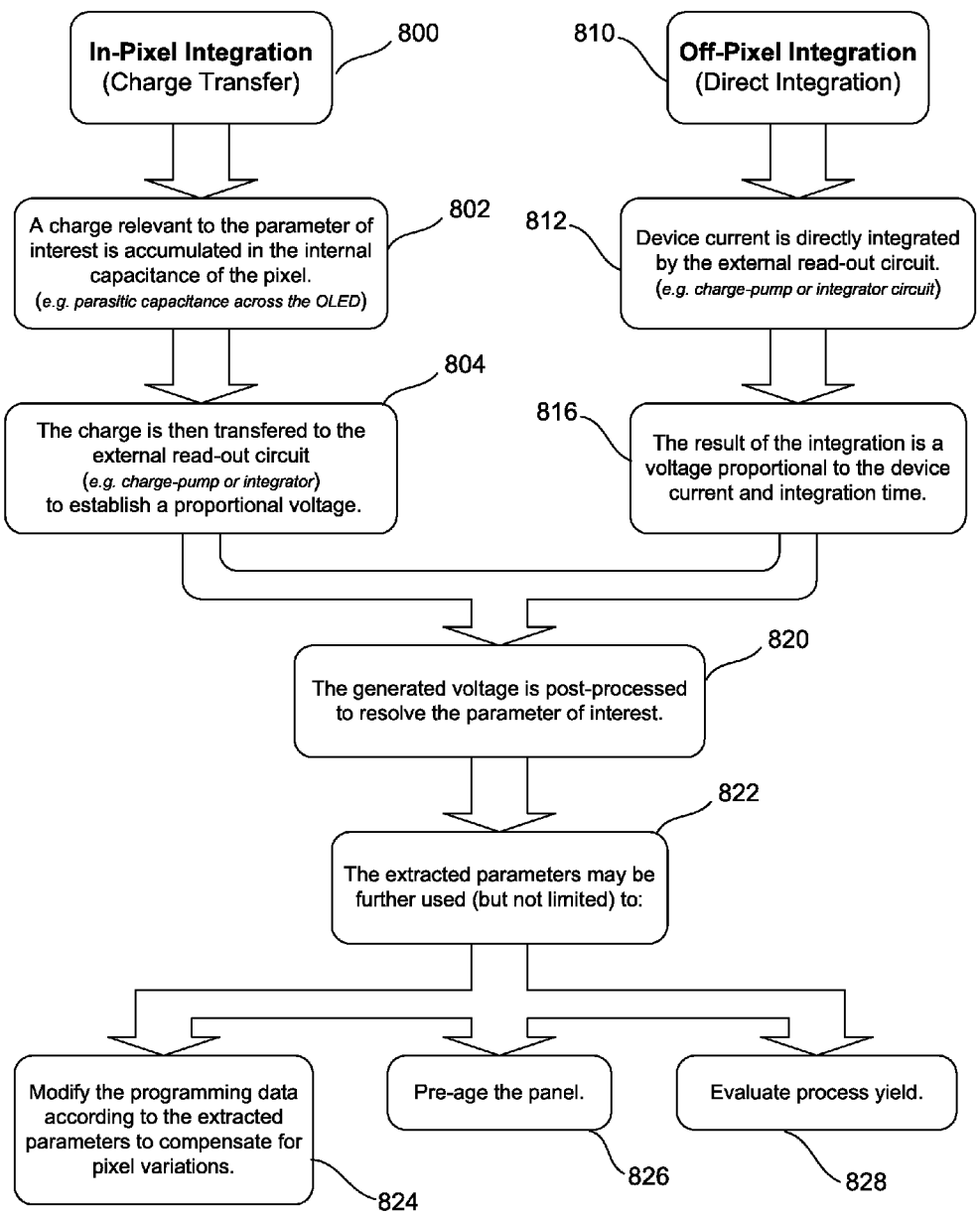
FIG. 8 is a flow diagram of different parameter extraction cycles and final applications.

FIG. 8 is a flow diagram of different extraction cycles and parameter applications for pixel circuits such as the two transistor circuit in FIG. 2 and the three transistor circuit in FIG. 5. One process is an in-pixel integration that involves charge transfer (800). A charge relevant to the parameter of interest is accumulated in the internal capacitance of the pixel (802). The charge is then transferred to the external read-out circuit such as the charge-pump or integrator to establish a proportional voltage (804). Another process is an off-pixel integration or direct integration (810). The device current is directly integrated by the external read-out circuit such as the charge-pump or integrator circuit (812).

In both processes, the generated voltage is post-processed to resolve the parameter of interest such as threshold voltage or mobility of the drive transistor or the turn-on voltage of the OLED (820). The extracted parameters may be then used for various applications (822). Examples of using the parameters include modifying the programming data according to the extracted parameters to compensate for pixel variations (824). Another example is to pre-age the panel of pixels (826). Another example is to evaluate the process yield of the panel of pixels after fabrication (828).

Figure 9:
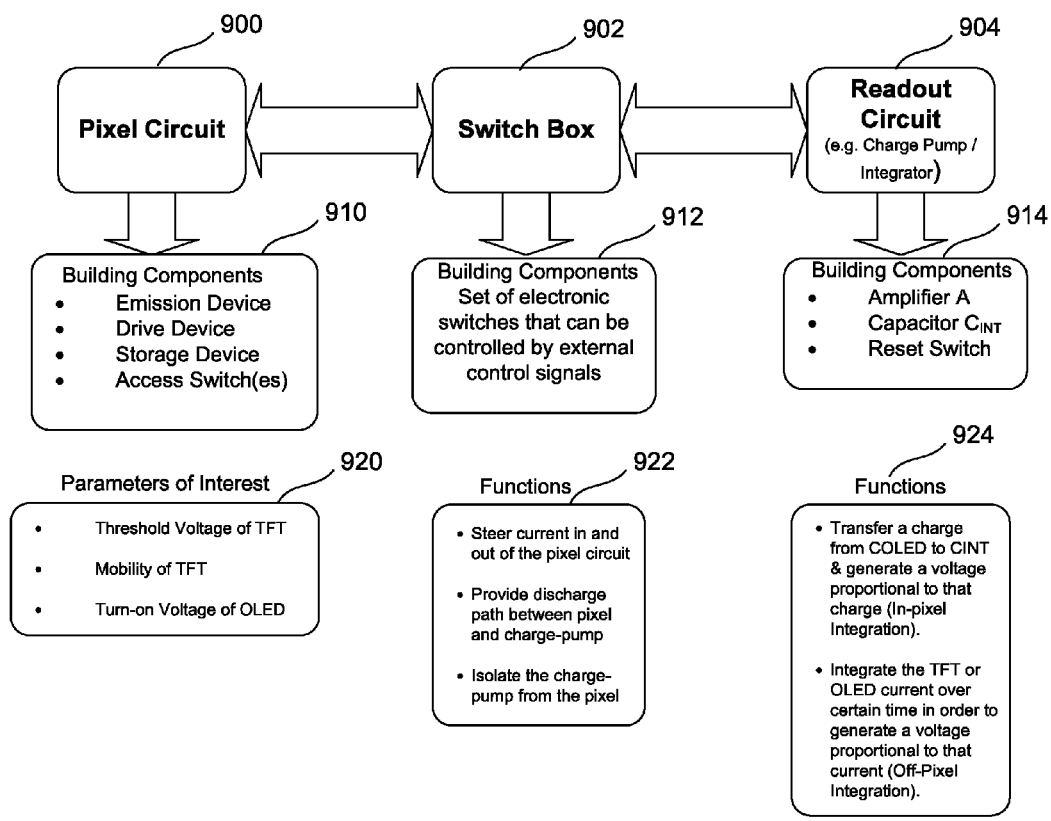
FIG. 9 is a block diagram and chart of the components of a data extraction system.

FIG. 9 is a block diagram and chart of the components of a data extraction system that includes a pixel circuit 900, a switch box 902 and a readout circuit 904 that may be a charge pump/integrator. The building components (910) of the pixel circuit 900 include an emission device such as an OLED, a drive device such as a drive transistor, a storage device such as a capacitor and access switches such as a select switch. The building components 912 of the switch box 902 include a set of electronic switches that may be controlled by external control signals. The building components 914 of the readout circuit 904 include an amplifier, a capacitor and a reset switch.

The parameters of interest may be stored as represented by the box 920. The parameters of interest in this example may include the threshold voltage of the drive transistor, the mobility of the drive transistor and the turn-on voltage of the OLED. The functions of the switch box 902 are represented by the box 922. The functions include steering current in and out of the pixel circuit 900, providing a discharge path between the pixel circuit 900 and the charge-pump of the readout circuit 904 and isolating the charge-pump of the readout circuit 904 from the pixel circuit 900. The functions of the readout circuit 904 are represented by the box 924. One function includes transferring a charge from the internal capacitance of the pixel circuit 900 to the capacitor of the readout circuit 904 to generate a voltage proportional to that charge in the case of in-pixel integration as in steps 800-804 in FIG. 8. Another function includes integrating the current of the drive transistor or the OLED of the pixel circuit 900 over a certain time in order to generate a voltage proportional to the current as in steps 810-814 of FIG. 8.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of determining the mobility of a drive transistor in a pixel circuit based on transient settling of the pixel circuit, the method comprising:
   setting the output of the drive transistor to a reset voltage;
   disconnecting the reset voltage and allowing the output voltage to be adjusted by the drive transistor;
   sampling the transient output voltage of the drive transistor at a fixed time interval; and
   calculating the mobility of the drive transistor from the sampled output voltage of the drive transistor.

2. The method of claim 1 wherein the threshold voltage of the drive transistor is compensated prior to calculating the mobility of the drive transistor.

3. A method of determining the mobility of a drive transistor in a pixel circuit based on transient settling of the pixel circuit, the method comprising:
   setting the output of the drive transistor to a reset voltage;
   disconnecting the reset voltage and allowing the output voltage to be adjusted by drive transistor;
   sampling the output voltage of the drive transistor at a fixed time interval; and
   calculating the mobility of the drive transistor from the sampled output voltage of the drive transistor,
   wherein the transient voltage is sampled at a plurality of different timing intervals and mobility is extracted from the sampled voltages.

4. A method of determining the mobility of a drive transistor in a pixel circuit based on transient settling of the pixel circuit, the method comprising:
   setting the output of the drive transistor to a reset voltage;
   disconnecting the reset voltage and allowing the output voltage to be adjusted by drive transistor;
   sampling the output voltage of the drive transistor at a fixed time interval; and
   calculating the mobility of the drive transistor from the sampled output voltage of the drive transistor,
   wherein the output voltage is amplified before sampling.

5. A method of extracting mobility from a drive transistor in a pixel circuit based on the transient settling of the drive transistor comprising:
   measuring the current of the drive transistor over a constant interval by converting the current into voltage by integration; and sampling the output voltage at constant interval; and
   calculating the mobility of the drive transistor from the measured current.

6. A method of extracting mobility from a drive transistor in a pixel circuit based on the transient settling of the drive transistor comprising:
   measuring the current of the drive transistor at a constant interval at a plurality of different timing intervals and mobility is extracted from the sampled currents.

* * * * *